(12) United States Patent
Lee et al.

(10) Patent No.: US 11,271,054 B2
(45) Date of Patent: Mar. 8, 2022

(54) ORGANIC LIGHT EMITTING DISPLAY DEVICE

(71) Applicant: Samsung Display Co., Ltd., Yongin-si (KR)

(72) Inventors: Hyeon Bum Lee, Hwaseong-si (KR); Hyoeng Ki Kim, Suwon-si (KR); Jun Hyuk Woo, Yongin-si (KR); Kwang Woo Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/384,806

(22) Filed: Apr. 15, 2019

(65) Prior Publication Data

US 2020/0119113 A1 Apr. 16, 2020

(30) Foreign Application Priority Data

Oct. 16, 2018 (KR) .......................... 10-2018-0123099

(51) Int. Cl.
*H01L 27/32* (2006.01)
*H01L 51/50* (2006.01)
(Continued)

(52) U.S. Cl.
CPC .......... *H01L 27/3246* (2013.01); *G06F 3/044* (2013.01); *G06F 3/0412* (2013.01); *H01L 27/322* (2013.01); *H01L 27/323* (2013.01); *H01L 27/3276* (2013.01); *H01L 51/5012* (2013.01); *H01L 51/5256* (2013.01); *H01L 51/5275* (2013.01); *H01L 51/5284* (2013.01); *G06F 2203/04111* (2013.01); *G06F 2203/04112* (2013.01)

(58) Field of Classification Search
CPC . H01L 27/3246; H01L 27/322; H01L 27/323; H01L 27/3276; H01L 51/5012; H01L 51/5256; H01L 51/5275; H01L 51/5284; H01L 2251/5338; H01L 27/3232; H01L 51/5281; H01L 27/3213; G06F 3/0412; G06F 3/044; G06F 2203/04111; G06F 2203/04112; G06F 3/0446; G06F 3/041; G09F 9/301
See application file for complete search history.

(56) References Cited

U.S. PATENT DOCUMENTS 8,963,138 B2 2/2015 Lim et al.
8,981,386 B2 3/2015 Lim et al.
(Continued)

FOREIGN PATENT DOCUMENTS

KR 10-2014-0014684 2/2014
KR 10-2014-0014685 2/2014
(Continued)

*Primary Examiner* — Su C Kim
(74) *Attorney, Agent, or Firm* — H.C. Park & Associates, PLC

(57) ABSTRACT

An organic light emitting display device including a base layer; an insulating layer disposed on the base layer and including a flat region having a flat surface and a lens region having a concave or convex surface; a dam disposed on the insulating layer and defining an opening exposing the lens region; and a color filter disposed on the lens region of the insulating layer and filling the opening, The dam includes a sensing electrode.

21 Claims, 20 Drawing Sheets

(51) Int. Cl.
    *H01L 51/52*     (2006.01)
    *G06F 3/041*     (2006.01)
    *G06F 3/044*     (2006.01)

(56) References Cited

U.S. PATENT DOCUMENTS

| | | | |
|---|---|---|---|
| 10,084,024 B2 | 9/2018 | Choi et al. | |
| 2010/0062147 A1* | 3/2010 | Kinoshita | G02F 1/133516 |
| | | | 427/58 |
| 2014/0339509 A1* | 11/2014 | Choi | H01L 51/5275 |
| | | | 257/40 |
| 2015/0049030 A1* | 2/2015 | Her | G06F 3/0412 |
| | | | 345/173 |
| 2015/0084026 A1* | 3/2015 | Miyamoto | H01L 51/5275 |
| | | | 257/40 |
| 2016/0109980 A1* | 4/2016 | Lee | G02F 1/1368 |
| | | | 345/174 |
| 2016/0252997 A1* | 9/2016 | Yao | G06F 3/0443 |
| | | | 345/174 |
| 2017/0025480 A1* | 1/2017 | Chiang | G06F 3/0445 |
| 2018/0182821 A1* | 6/2018 | Yun | H01L 27/323 |
| 2018/0350892 A1* | 12/2018 | Nishinohara | H01L 27/3276 |
| 2018/0356925 A1* | 12/2018 | Liu | G02F 1/13338 |
| 2019/0074339 A1* | 3/2019 | Ma | H01L 27/3258 |

FOREIGN PATENT DOCUMENTS

| | | |
|---|---|---|
| KR | 10-2016-0017397 | 2/2016 |
| KR | 10-2017-0088473 | 8/2017 |
| KR | 10-2018-0027467 | 3/2018 |

* cited by examiner

FF1_1

IE2
PDL
PXA_B

PXA_R  RA_1  PXA_G

ORGANIC LIGHT EMITTING DISPLAY DEVICE

CROSS-REFERENCE TO RELATED APPLICATION

This application claims priority from and the benefit of Korean Patent Application No. 10-2018-0123099, filed on Oct. 16, 2018, which is hereby incorporated by reference for all purposes as if fully set forth herein.

BACKGROUND

Field

Exemplary embodiments of the invention relate generally to an organic light emitting display device.

Discussion of the Background

The importance of a display device has increased with the development of multimedia. Accordingly, various types of display devices, such as a liquid crystal display (LCD) and an organic light emitting display (OLED), have been used.

Among them, an organic light emitting display device displays an image by using an organic light emitting element which generates light by recombination of electrons and holes. The organic light emitting display device is advantageous in that it has a rapid response speed, high luminance, and a wide viewing angle, and is driven with low power consumption.

Since the performance of an organic light emitting display device is deteriorated by the presence of external moisture or oxygen, an organic light emitting element is typically encapsulated to be protected from external moisture or oxygen. Recently, in order to make the organic light emitting display device thin and/or flexible, thin film encapsulation (TFE) composed of a plurality of layers including an inorganic film and a plurality of inorganic films or organic films has been used as means for encapsulating the organic light emitting element.

Recently, the organic light emitting display device has an image display function and includes a touch sensing electrode for receiving the touch of a user. Thus, it has become easier for the user to use the organic light emitting display device through the touch sensing electrode.

The organic light emitting display device may include a color filter for reducing external light reflection.

The above information disclosed in this Background section is only for understanding of the background of the inventive concepts, and, therefore, it may contain information that does not constitute prior art.

SUMMARY

Exemplary embodiments of the present invention provide an organic light emitting display device having a large viewing angle and a large luminance ratio, and an organic light emitting display device capable of reducing external light reflection by a touch electrode.

Exemplary embodiments of the present invention also provide a method of manufacturing an organic light emitting display device, which can simplify a process by reducing the number of masks.

Additional features of the inventive concepts will be set forth in the description which follows, and in part will be apparent from the description, or may be learned by practice of the inventive concepts.

An exemplary embodiment of the present invention provides an organic light emitting display device including a base layer; an insulating layer disposed on the base layer and including a flat region having a flat surface and a lens region having a concave or convex surface; a dam disposed on the insulating layer and defining an opening exposing the lens region; and a color filter disposed on the lens region of the insulating layer and filling the opening. The dam includes a sensing electrode.

Another exemplary embodiment of the present invention provides an organic light emitting display device including a base substrate; a pixel electrode disposed on the base substrate; a pixel defining layer disposed on the pixel electrode and having a first opening exposing a part of the pixel electrode; an organic light emitting layer disposed on the exposed pixel electrode; a common electrode disposed on the organic light emitting layer and the pixel defining layer; an encapsulation layer disposed on the common electrode; a first touch conductive layer disposed on the encapsulation layer; an insulating layer disposed on the first touch conductive layer; a dam disposed on the insulating layer and having a second opening exposing at least a part of the insulating layer; and a color filer disposed on the exposed insulating layer. The dam includes a second touch conductive layer disposed on the insulating layer, a black matrix disposed on the second touch conductive layer, and a liquid-repellent material layer disposed on the black matrix.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
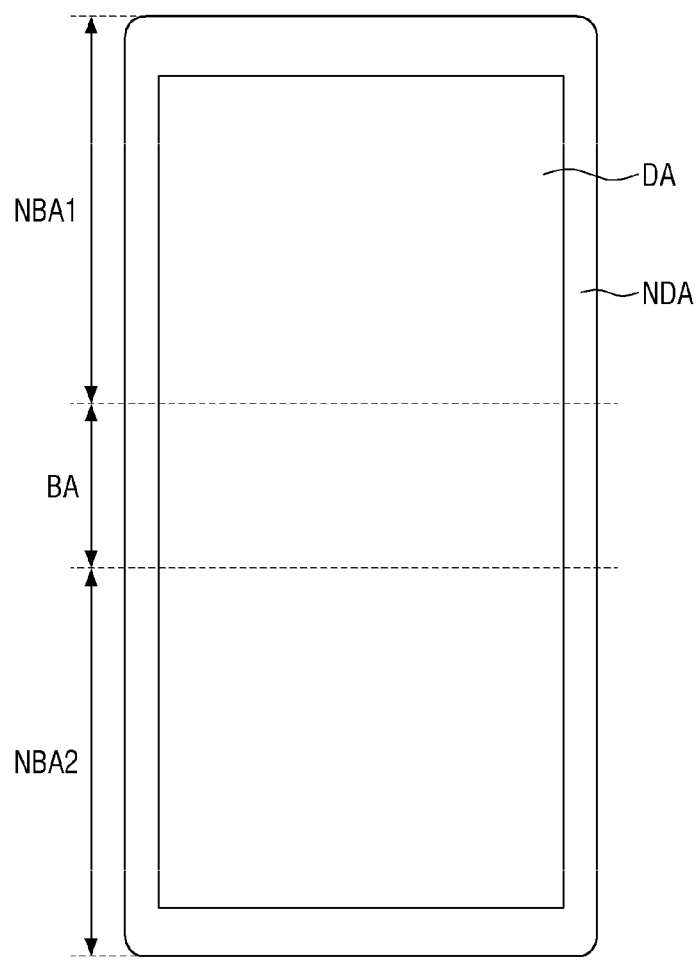
FIG. 1 is a plan view of an organic light emitting display device according to an exemplary embodiment of the present invention.
Figure 1:
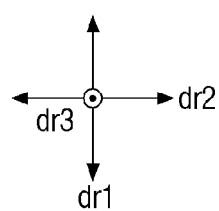

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A display device according to the inventive concepts is a device for displaying a moving image or a still image, or a device for displaying a stereoscopic image, and may be used as a display screen for various products, such as televisions, notebook computers, monitors, billboards, and things of the Internet, as well as portable electronic appliances, such as mobile communication terminals, smart phones, tablet PCs, smart watches, and navigators.

Hereinafter, exemplary embodiments of the present invention will be described with reference to the attached drawings. The same or similar reference numerals are used for the same components in the drawings.

Figure 2:
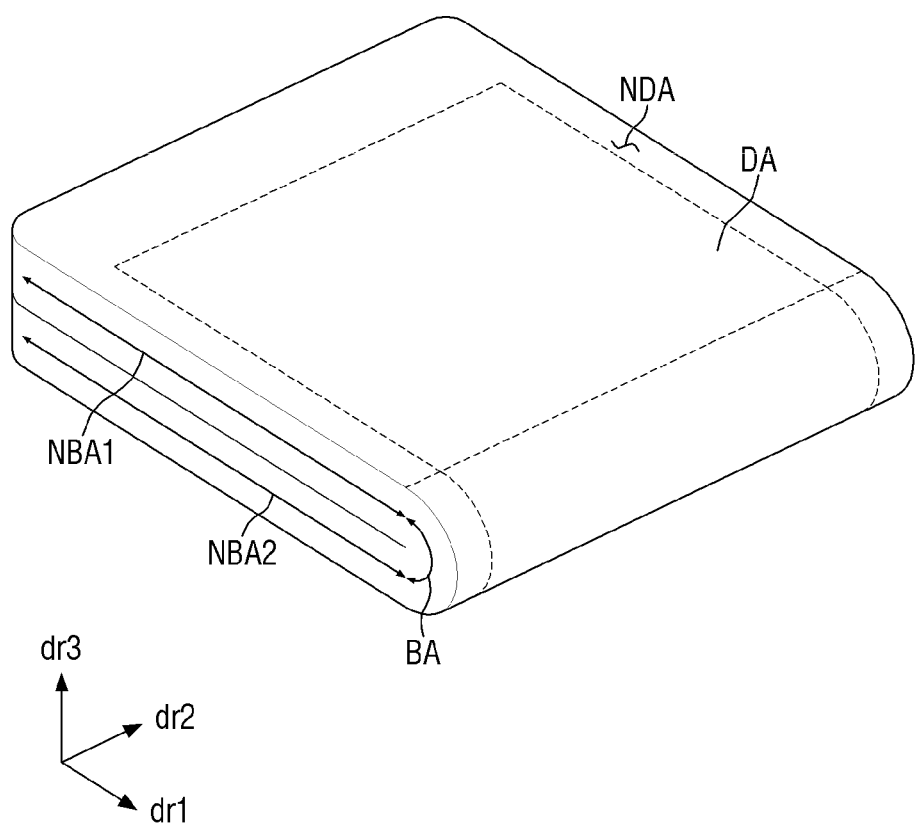
FIG. 2 is a perspective view of an organic light emitting display device according to an exemplary embodiment of the present invention.
Figure 3:
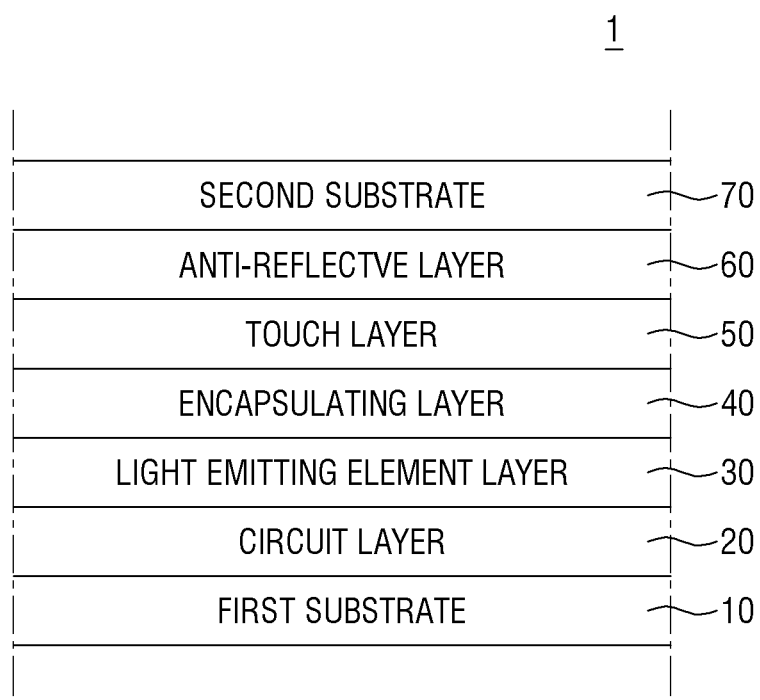
FIG. 3 is a schematic cross-sectional view of an organic light emitting display device according to an exemplary embodiment of the present invention.

FIG. 1 is a plan view of an organic light emitting display device according to an exemplary embodiment of the present invention. FIG. 2 is a perspective view of an organic light emitting display device according to an exemplary embodiment of the present invention. FIG. 3 is a schematic cross-sectional view of an organic light emitting display device according to an exemplary embodiment of the invention.

Referring to FIGS. 1 and 2, an organic light emitting display device 1 may have folding properties.

The organic light emitting display device 1 may have a rectangular shape in which a length in a first direction dr1 is greater than a length in a second direction dr2, when it is unfolded. That is, the rim of the organic light emitting display device 1 may include long sides extending in the first direction dr1 and short sides extending in the second direction dr2. The rim of the organic light emitting display device 1 may include a curved corner between adjacent long and short sides. However, it should be understood that the inventive concepts are not limited to the aforementioned directions and that the first direction dr1 and the second direction dr2 refer to relative directions intersecting each other.

The organic light emitting display device 1 may include a display area DA and a non-display area NDA.

The display area DA is defined as an area where an image is displayed. The organic light emitting display device 1 may include a plurality of pixels in the display area DA. The display area DA may be used not only as an area for displaying an image but also as an area for recognizing a user's touch input or fingerprint.

The non-display area NDA is defined as an area where no image is displayed. The non-display area NDA may be disposed outside the display area DA. The non-display area NDA may be disposed to surround the display area DA. In an exemplary embodiment, the non-display area NDA may be a ring-shaped area having an outer rim and an inner rim each having a rectangular shape with rounded corners, but the shape thereof is not limited thereto.

A speaker module, a camera module, a sensor module, and the like may be disposed in a part of the non-display area NDA. In an exemplary embodiment, the sensor module may include at least one of a luminance sensor, a proximity sensor, an infrared sensor, and an ultrasonic sensor. The arrangement of the speaker module, the camera module, and the sensor module is not limited to that shown in the drawings.

The organic light emitting display device 1 may be bent and spread. The organic light emitting display device 1 may include a bending area BA which is bent based on a bending axis, and a first non-bending area NBA1 and a second non-bending area NBA2, which are not bent on either side of the bending axis. In an exemplary embodiment, the organic light emitting display device 1 may be in-folded such that the display area DA is bent inward. However, the inventive concepts are not limited thereto. In another exemplary embodiment, the organic light emitting display device may be out-folded such that the display area DA is bent outward.

Referring to FIG. 3, in an exemplary embodiment, the organic light emitting display device 1 may include a first substrate 10, a circuit layer 20 disposed on the first substrate 10, a light emitting element layer 30 disposed on the circuit layer 20, an encapsulation layer 40 disposed on the light emitting element layer 30, a touch layer 50 disposed on the encapsulation layer 40, an anti-reflective layer 60 disposed on the touch layer 50, and a second substrate 70 disposed on the anti-reflective layer 60. However, the inventive concepts are not limited thereto. Each of the layers may have a single-layer or multi-layer structure, and, if necessary, each layer may be provided with an additional layer or a part thereof may be omitted. A laminate structure of the organic light emitting layer 1 will be described later in detail.

The touch layer 50 may include a touch sensing unit 50a that senses a touch input of a user. First, the arrangement structure of the components constituting the touch layer 50 will be described with reference to FIG. 4.

Figure 4:
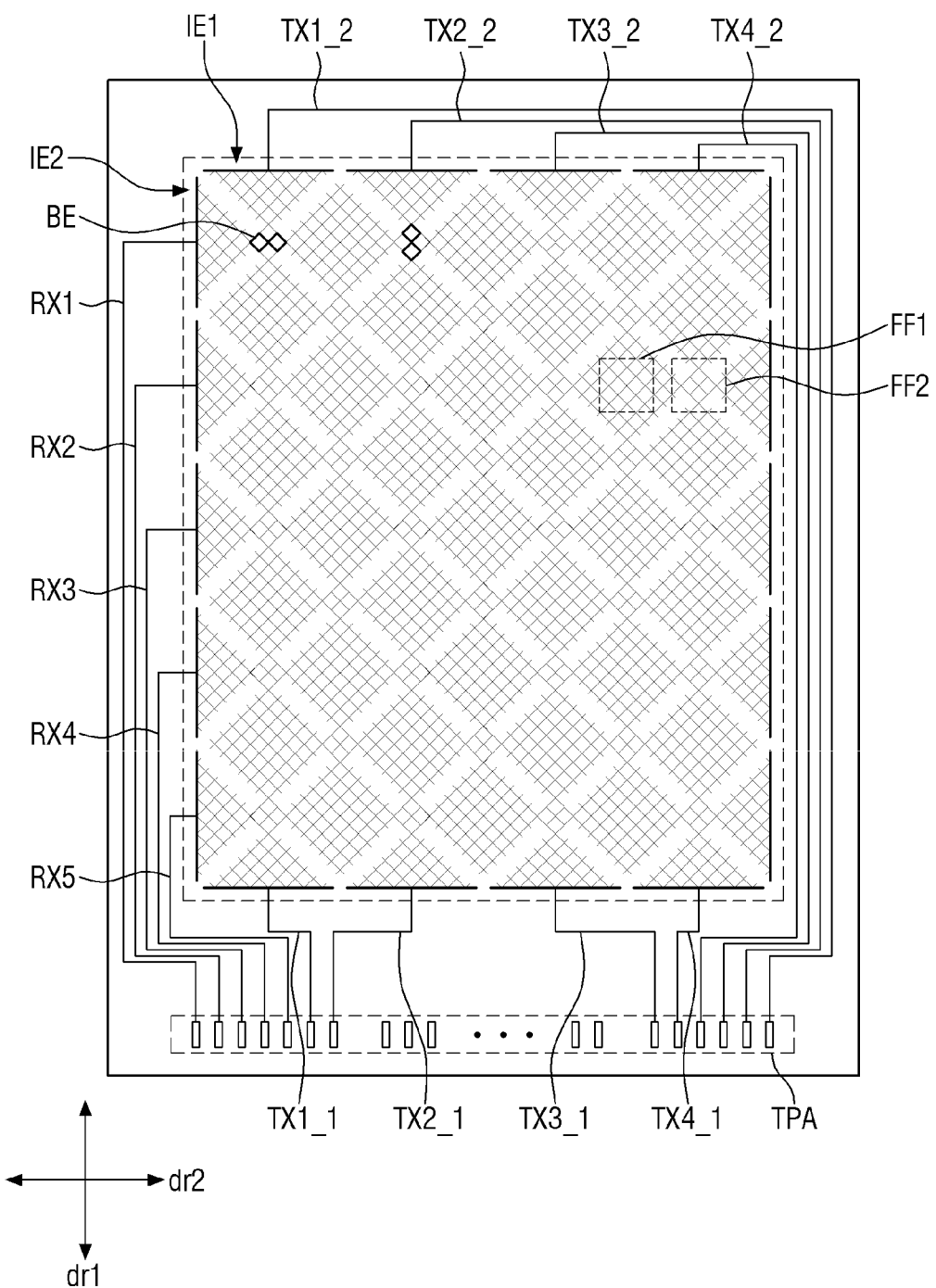
FIG. 4 is a plan view schematically showing a layout structure of a touch sensing unit.

FIG. 4 is a plan view schematically showing a layout structure of a touch sensing unit.

Referring to FIG. 4, the touch sensing unit 50a includes a plurality of first sensing electrodes IE1, a plurality of second sensing electrodes IE2, a signal wiring unit (RX, TX), and a pad terminal unit TPA.

The organic light emitting display device 1 includes a base layer where the touch sensing unit 50a is disposed. For example, the base layer may correspond to a second inorganic film 453 of an encapsulation layer 450, but the inventive concepts are not limited thereto. The aforementioned display area DA and non-display area NDA may be defined in the base layer. The bending area BA, the first non-bending area NBA1, and the second bending area NBA2 may also be defined in the base layer.

The signal wiring unit (RX, TX) may include a plurality of signal wirings RX and TX. One end of each of the plurality of signal wirings RX and TX is directly connected to the first sensing electrode IE1 or the second sensing electrode IE2, and the other end thereof is directly connected to the pad terminal unit TPA, so as to electrically connect the first and second sensing electrodes IE1 and IE2 to the pad terminal unit TPA. The signal wiring unit (RX, TX) may be disposed so as to surround the outer sides of the first and second sensing electrodes IE1 and IE2. For convenience of explanation, the space of an area in which the signal wiring unit (RX, TX) is disposed is exaggerated in the drawings.

The plurality of first sensing electrodes IE1 and the plurality of second sensing electrodes IE2 may overlap the display area DA, and may not overlap the non-display area NDA. The signal wiring unit (RX, TX) and the pad terminal unit TPA may overlap the non-display area NDA, and may not overlap the display area DA. In this specification, unless otherwise defined, the expression "overlap" means that two components overlap each other in the thickness direction of the organic light emitting display device 1 (for example, a direction perpendicular to the surface of a base substrate 101, that is, a third direction dr3 in the drawings).

The first sensing electrode IE1 and the second sensing electrode IE2 may each include a plurality of mesh patterns.

In the present exemplary embodiment, a case where the first sensing electrode IE1 is a driving electrode and the second sensing electrode IE2 is a sensing electrode will be described as an example. In another exemplary embodiment, the first sensing electrode IE1 may be a sensing electrode, and the second sensing electrode IE2 may be a driving electrode.

It is illustrated in the drawings that the first sensing electrode IE1 includes first to fourth driving electrodes spaced apart in the second direction dr2 and the second sensing electrode IE2 includes first to fifth sensing electrodes spaced apart in the first direction dr1. Further, it is illustrated in the drawings that each of the driving electrodes includes six mesh patterns arranged in the first direction dr1 and each of the sensing electrodes includes five mesh patterns arranged in the second direction dr2. However, the number of the first and second sensing electrodes IE1 and IE2 and the number of mesh patterns included in each of the first and second sensing electrodes IE1 and IE2 are not limited to those illustrated above.

The plurality of first sensing electrodes IE1 and the plurality of second sensing electrodes IE2 may include, but are not limited to, silver, aluminum, copper, chromium, nickel, titanium, by which a low-temperature process is possible. Damage to an organic light emitting diode can be prevented even if the sensing electrodes IE1 and IE2 are formed by a continuous process.

Although it is shown in the drawing that the pad terminal unit TPA is disposed at the lower side of the organic light emitting display device 1 and includes a plurality of pad terminals spaced apart in the first direction dr1, the position of the pad terminal unit and the arrangement of pad terminals are not limited.

The signal wiring unit (RX, TX) includes a plurality of touch driving wirings TX for connecting each of the driving electrodes and the pad terminal unit TPA and a plurality of touch sensing wirings RX for connecting each of the sensing electrodes and the pad terminal unit TPA.

In an exemplary embodiment, each of the driving electrodes may be connected to the plurality of touch driving wirings TX1_1 to TX4_1 and TX1_2 to TX4_2. That is, each of the driving electrodes may be double-routed. The touch driving wirings TX1_2 to TX4_2 connected to the upper side of each of the driving electrodes may be arranged to bypass the respective sensing electrodes IE1 and IE2 along one side edge.

Each of the touch sensing wirings RX1 to RX5 may be connected to one sensing electrode. That is, each of the sensing electrodes may be single-routed. The touch sensing wirings RX1 to RX5 may be arranged to bypass the respective sensing electrodes IE1 and IE2 along the other side edge.

The driving voltage signal provided to each driving electrode may be a driving voltage signal having a voltage level higher than that of the sensing voltage signal provided to each sensing electrode. Since a signal having a relatively high voltage level is provided to each driving electrode, the voltage level in the touch sensing electrode may be greatly changed for each position depending on the distance from the wiring. For example, when one of the touch driving wirings TX1_1 to TX5_1 is connected only to one side end of each driving electrode, the voltage level of the mesh pattern adjacent to the one side end may be greatly different from the voltage level of the mesh pattern adjacent to the other side end. The plurality of touch driving wirings TX1_1 to TX4_1 and TX1_2 to TX4_2 are connected to each driving electrode, and thus, it is possible to minimize the voltage level difference between the mesh patterns disposed adjacent to both ends of each driving electrode. However, the number and arrangement of the touch driving wirings TX1_1 to TX4_1 and TX1_2 to TX4_2 and the touch sensing wirings RX1 to RX5 are not limited to those shown in the drawings.

Next, the arrangement relationship of the touch sensing unit 50a and each component of the organic light emitting display device 1 will be described with reference to FIGS. 4 to 8 together with FIG. 3.

Figure 5:
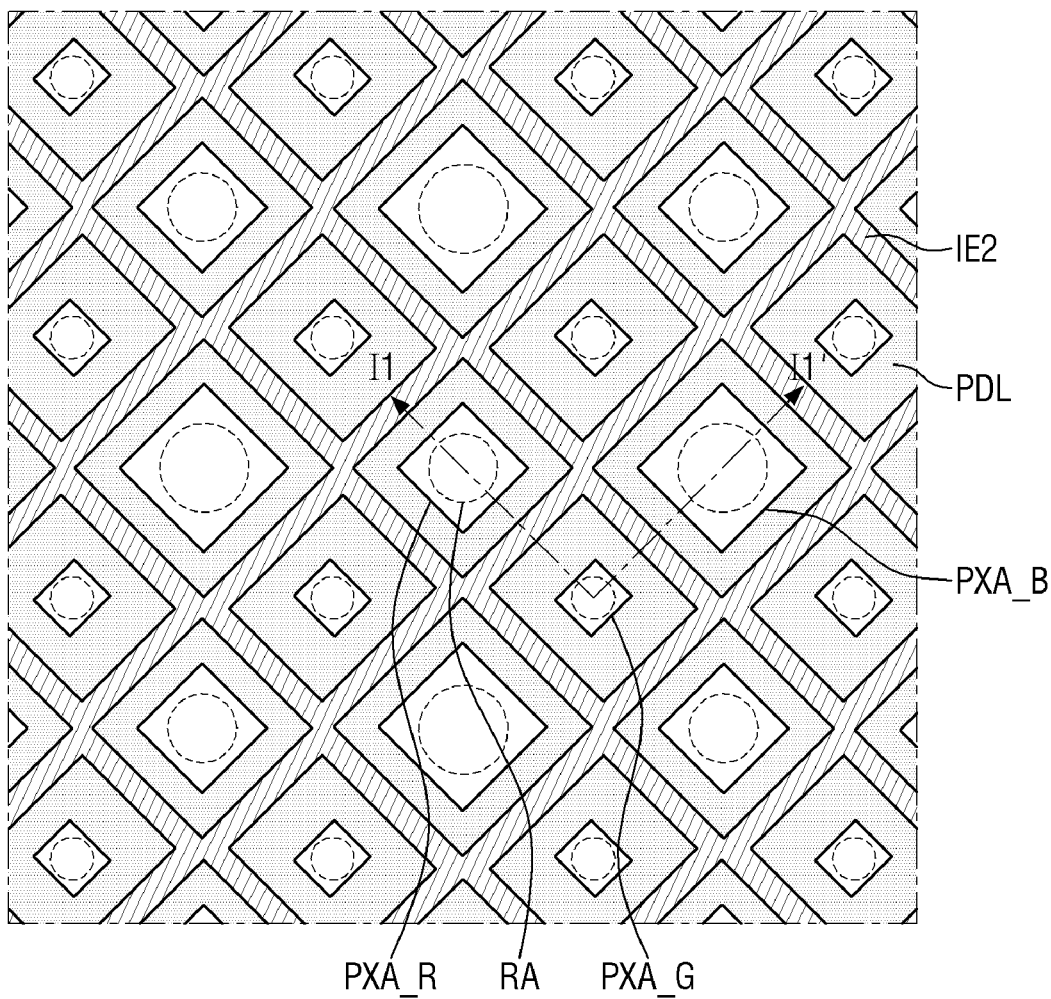
FIG. 5 is an enlarged view of the portion FF1 of FIG. 4.
Figure 6:
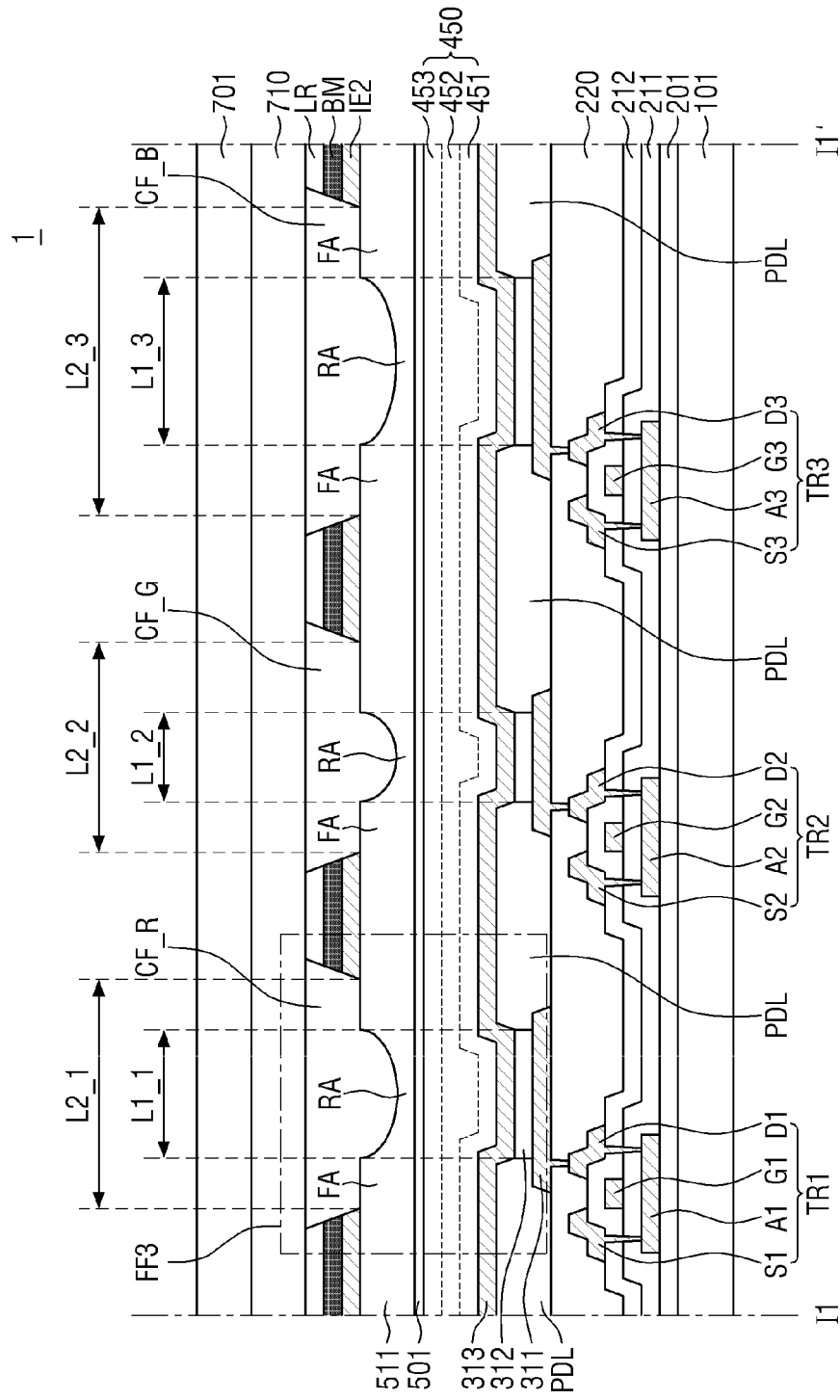
FIG. 6 is a cross-sectional view of a part of an organic light emitting display device taken along the line I1-I1' of FIG. 5.
Figure 7:
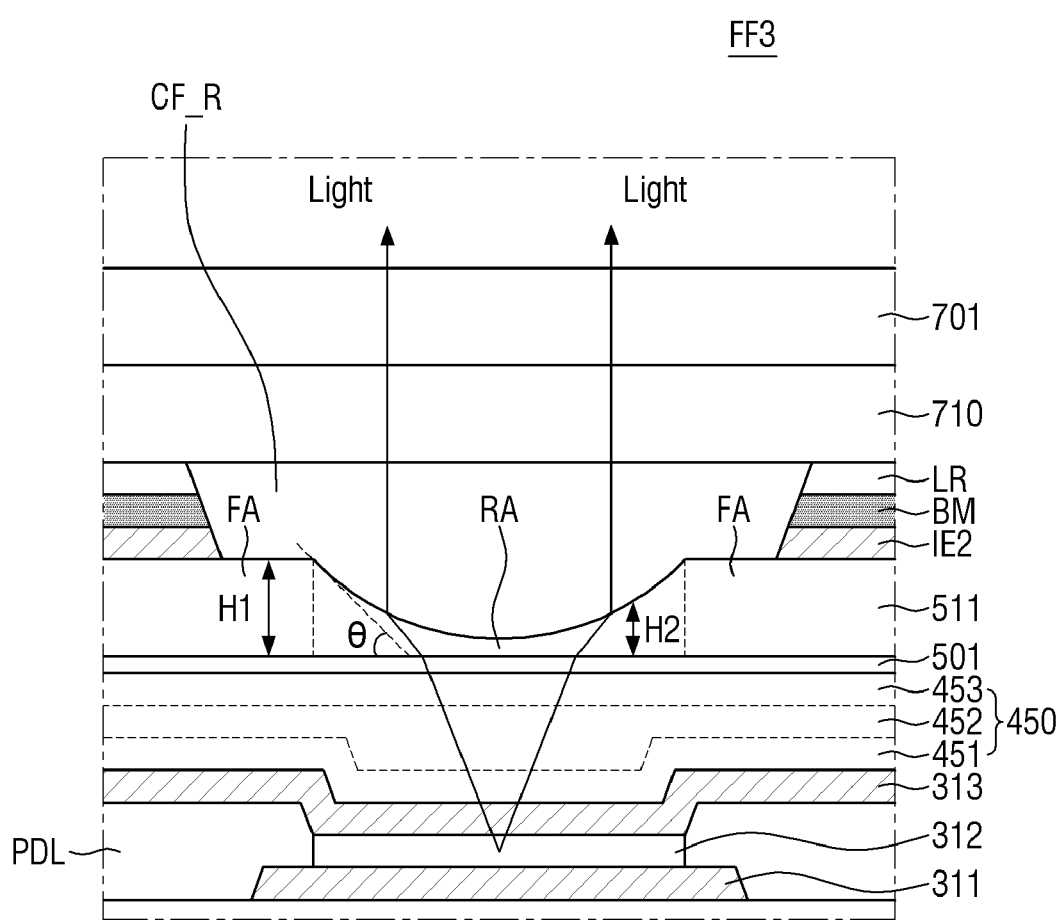
FIG. 7 is an enlarged view of the portion FF3 of FIG. 6.
Figure 8:
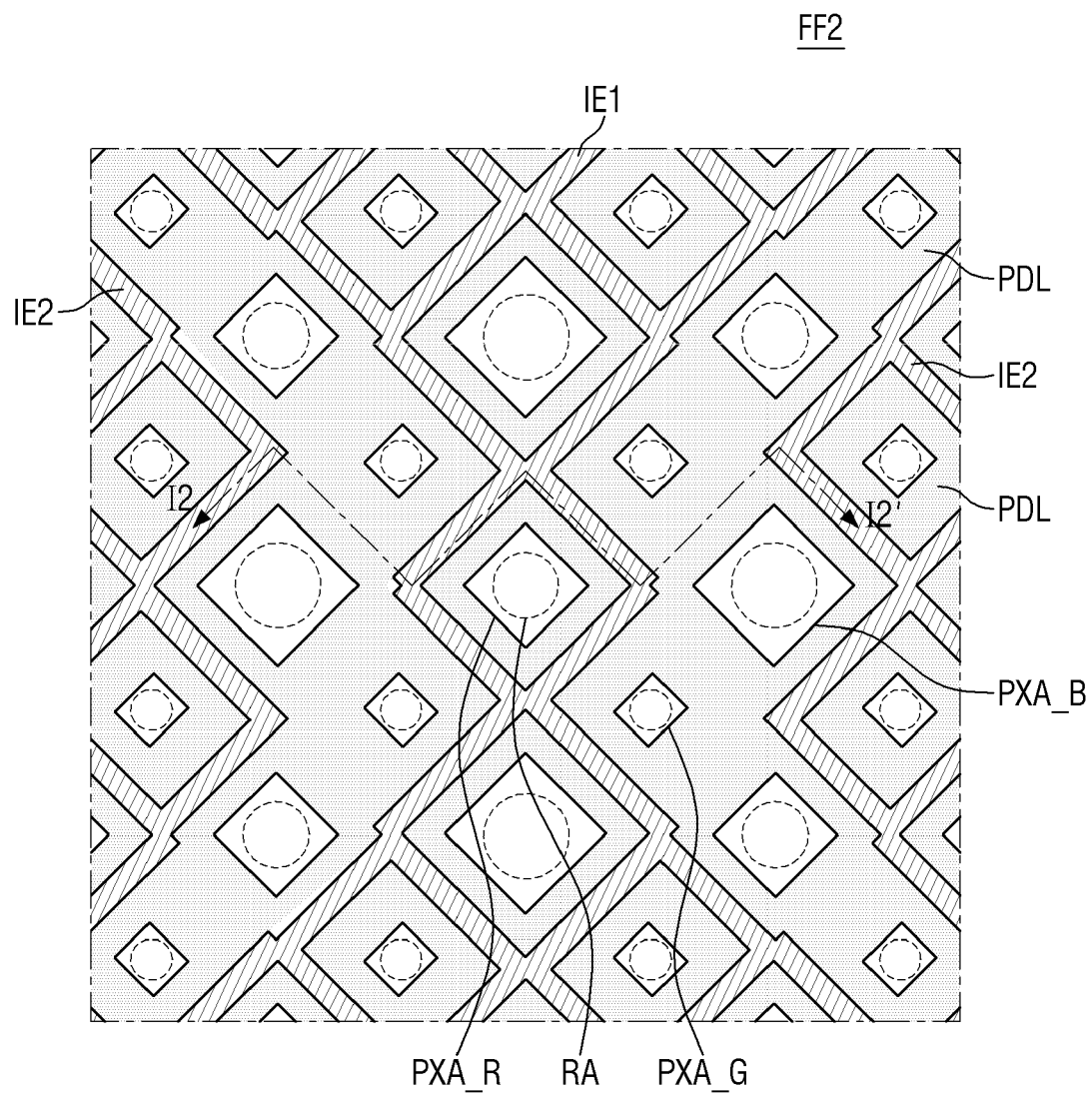
FIG. 8 is an enlarged view of the portion FF2 of FIG. 4.
Figure 9:
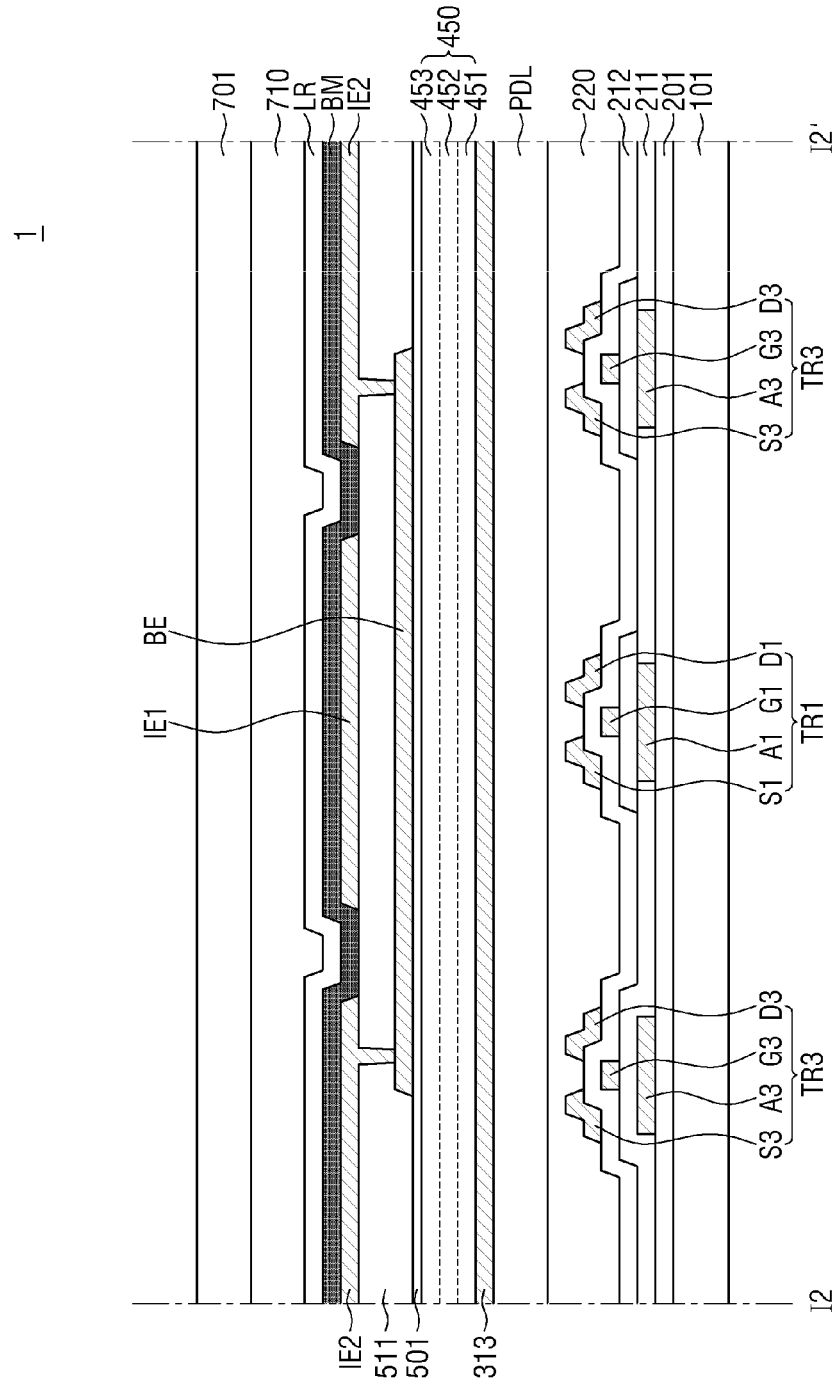
FIG. 9 is a cross-sectional view of a part of an organic light emitting display device taken along the line I2-I2' of FIG. 8.

FIG. 5 is an enlarged view of the portion FF1 of FIG. 4. FIG. 6 is a cross-sectional view of a part of an organic light emitting display device taken along the line I1-I1' of FIG. 5. FIG. 7 is an enlarged view of the portion FF3 of FIG. 6. FIG. 8 is an enlarged view of the portion FF2 of FIG. 4. FIG. 9 is a cross-sectional view of a part of an organic light emitting display device taken along the line I2-I2' of FIG. 8.

Referring to FIG. 4 together with FIG. 3, the organic light emitting display device 1 includes light emitting regions PXA_R, PXA_G, and PXA_B, and non-light emitting regions surrounding the outer sides of the respective light emitting regions PXA_R, PXA_G, and PXA_B and dividing the respective light emitting regions PXA_R, PXA_G, and PXA_B. The light emitting regions PXA_R, PXA_G, and PXA_B may be divided by a pixel defining layer PDL. That is, a portion overlapping the pixel defining layer PDL in the display area DA may be a non-light emitting region, and a portion not overlapping the pixel defining layer PDL may be a light emitting region PXA_R, PXA_G, or PXA_B. In an exemplary embodiment, the non-light emitting region may be formed in the shape of a mesh, but the shape thereof is not limited thereto.

The mesh pattern of each of the sensing electrodes IE1 and IE2 may define a plurality of mesh holes. The mesh holes may correspond one-to-one to the light emitting regions PXA_R, PXA_G, and PXA_B. The mesh holes may be included in the non-light emitting region.

The light emitting regions PXA_R, PXA_G, and PXA_B may be divided into a plurality of groups according to the color of light generated in the organic light emitting diodes. FIG. 4 illustrates the light emitting regions PXA_R, PXA_G, and PXA_B divided into three groups depending on the color of light.

The light emitting regions PXA_R, PXA_G, and PXA_B may have different areas from each other depending on the color of light emitted from a light emitting layer (312 of FIG. 5) of the organic light emitting diode. The areas of the light emitting regions PXA_R, PXA_G, and PXA_B may be determined depending on the kind of the organic light emitting diodes. For example, the light emitting regions PXA_R, PXA_G, and PXA_B may include a first light emitting region PXA_R, a second light emitting region PXA_G, and a third light emitting region PXA_B. The light emitting regions PXA_R, PXA_G, and PXA_B may be formed to have a larger area in the order of the second light emitting region PXA_G, the first light emitting region PXA_R, and the third light emitting region PXA_B. In the present exemplary embodiment, although it is exemplified that the first light emitting region PXA_R is a light emitting region emitting red light, the second light emitting region PXA_G is a light emitting region emitting green light, and the third light emitting region PXA_B is a light emitting region emitting blue light, the inventive concepts are not limited thereto. In another exemplary embodiment, the first to third light emitting regions PXA_R, PXA_G, and PXA_B may be light emitting regions emitting cyan, magenta and yellow light instead of red, green, and blue light.

The mesh holes may be divided into a plurality of groups having different areas from each other. The mesh holes may be divided into three groups according to the corresponding light emitting regions PXA_R, PXA_G, and PXA_B.

However, it is illustrated that the mesh holes correspond one-to-one to the light emitting regions PXA_R, PXA_G, and PXA_B, but the inventive concepts are not limited thereto. Each of the mesh holes may correspond to two or more light emitting regions PXA_R, PXA_G, and PXA_B. It is illustrated that the areas of the light emitting regions PXA_R, PXA_G, and PXA_B are various, but the inventive concepts are not limited thereto. The sizes of the light emitting regions PXA_R, PXA_G, and PXA_B may be equal to each other, and the sizes of the mesh holes may also be equal to each other.

The planar shape of the mesh holes is not limited, and may have a polygonal shape different from the rhombus. The planar shape of the mesh holes may have a polygonal shape with rounded corners.

Since the plurality of first sensing electrodes IE1 and the plurality of second sensing electrodes IE2 have a mesh shape, the plurality of first sensing electrodes IE1 and the plurality of second sensing electrodes IE2 do not overlap the light emitting regions PXA_R, PXA_G, and PXA_B, so that they may not be viewed by the user of the organic light emitting display device 1. Further, the parasitic capacitance between the first sensing electrode IE1 and the plurality of second sensing electrodes IE2 with respect to the respective electrodes of the light emitting element layer 30 may be reduced.

Hereinafter, a lamination relationship of an organic light emitting display device will be described in more detail with reference to FIG. 6.

A base substrate 101 may be a rigid or flexible substrate. Here, when the base substrate 101 is a rigid substrate, the base substrate 101 may be a glass substrate, a quartz substrate, a glass ceramic substrate, or a crystalline glass substrate. When the base substrate 101 is a flexible substrate, the base substrate 101 may be one of a film substrate including a polymer organic material and a plastic substrate.

The base substrate 101 may be provided with the aforementioned display area DA and non-display area NDA.

The base substrate 101 shown in FIG. 6 may correspond to the substrate 10 of FIG. 2.

A buffer layer 201 is disposed on the base substrate 101. The buffer layer 201 functions to smooth the surface of the base substrate 101 and prevent the penetration of moisture or outside air. The buffer layer 201 may be an inorganic film. The buffer layer 201 may be a single-layer film or a multi-layer film.

A plurality of thin film transistors TR1, TR2, and TR3 are disposed on the buffer layer 201. Here, the plurality of thin film transistors TR1, TR2, and TR3 may be driving thin film transistors.

The plurality of thin film transistors TR1, TR2, and TR3 may include a first thin film transistor TR1, a second thin film transistor TR2, and a third thin film transistor TR3. At least one of each of the thin film transistors TR1, TR2, and TR3 may be provided for each pixel. For example, the first thin film transistor TR1 may be provided in the first light emitting region PXA_R, the second thin film transistor TR2 may be provided in the second light emitting region PXA_G, and the third thin film transistor TR3 may be provided in the third light emitting region PXA_B.

The thin film transistors TR1, TR2, and TR3 may include semiconductor layers A1, A2, and A3, gate electrodes G1, G2, and G3, source electrodes S1, S2, and S3, and drain electrodes D1, D2, and D3, respectively. More specifically, each of the semiconductor layers A1, A2, and A3 is disposed on the buffer layer 201. Each of the semiconductor layers A1, A2, and A3 may include amorphous silicon, poly silicon, low-temperature poly silicon, and an organic semiconductor. In another exemplary embodiment, each of the semiconductor layers A1, A2, and A3 may include an oxide semiconductor. Although not clearly shown, each of the semiconductor layers A1, A2, and A3 may include a channel region, and source and drain regions disposed on both sides of the channel region and doped with impurities.

A gate insulating film 211 is disposed on the semiconductor layers A1, A2, and A3. The gate insulating film 211 may be an inorganic film. The gate insulating film 211 may be a single-layer film or a multi-layer film.

Each of the gate electrodes G1, G2, and G3 is disposed on the gate insulating film 211. Each of the gate electrodes G1, G2, and G3 may be formed of a conductive metal material. For example, each of the gate electrodes G1, G2, and G3 may include molybdenum (Mo), aluminum (Al), copper (Cu), or titanium (Ti). Each of the gate electrodes G1, G2, and G3 may be a single-layer film or a multi-layer film.

An interlayer insulating film 212 is disposed on the gate electrodes G1, G2, and G3. The interlayer insulating film 212 may be an inorganic film. The interlayer insulating film 212 may be a single-layer film or a multi-layer film.

The source electrodes S1, S2, and S3 and the drain electrodes D1, D2, and D3 are disposed on the interlayer insulating film 212. The source electrodes S1, S2, and S3 and the drain electrodes D1, D2, and D3 are formed of a conductive metal material. For example, the source electrodes S1, S2, and S3 and the drain electrodes D1, D2, and D3 may include aluminum (Al), copper (Cu), titanium (Ti), or molybdenum (Mo).

The source electrodes S1, S2, and S3 and the drain electrodes D1, D2, and D3 may be electrically connected to the source regions and drain regions of the semiconductor layer A1, A2, and A3 through contact holes penetrating the interlayer insulating film 212 and the gate insulating film 211, respectively.

Although not shown in the drawings, the organic light emitting display device 1 may further include a storage capacitor and a switch thin film transistor on the base substrate 101.

A protective layer 220 is disposed on the source electrodes S1, S2, and S3, the drain electrodes D1, D2, and D3, and the interlayer insulating film 212. Here, the protective layer 220 is disposed to cover a circuit unit including the thin film transistors TR1, TR2, and TR3. The protective layer 220 may be a passivation film or a planarizing film. The passivation film may include $SiO_2$, $SiN_x$, or the like, and the planarizing film may include a material, such as acrylate or polyimide. The protective layer 220 may include both the passivation film and the planarizing film. In this case, the passivation film may be disposed on the source electrodes S1, S2, and S3, the drain electrodes D1, D2, and D3, and the interlayer insulating film 212, and the planarization film may be disposed on the passivation film. The upper surface of the protective layer 220 may be flat.

The buffer layer 201 to the protective layer 220, shown in FIG. 6, may correspond to the circuit layer 20 of FIG. 2.

A plurality of first pixel electrodes 311 are disposed on the protective layer 220. Each of the first pixel electrodes 311 may be a pixel electrode disposed for each of the light emitting regions PXA_R, PXA_G, and PXA_B. Each of the first pixel electrodes 311 may be an anode electrode of an organic light emitting diode.

The first pixel electrodes 311 may be electrically connected to the drain electrodes D1, D2, and D3 (or the source electrodes S1, S2, and S3) disposed on the base substrate 101 through via-holes penetrating the passivation layer 213.

The first pixel electrodes 311 may have different areas corresponding to the areas of the light emitting regions PXA_R, PXA_G, and PXA_B.

Each of the first pixel electrodes 311 may include a material having a high work function. Each of the first pixel electrodes 311 may include indium-tin-oxide (ITO), indium-zinc-oxide (IZO), zinc oxide (ZnO) indium oxide ($In_2O_3$), or the like.

A pixel defining layer PDL is disposed on the first pixel electrodes 311. The pixel defining layer PDL includes a plurality of first openings L1_1, L1_2, and L1_3 each exposing at least a part of each of the first pixel electrodes 311. The plurality of first openings L1_1, L1_2, and L1_3 may have different widths corresponding to the areas of the light emitting regions PXA_R, PXA_G, and PXA_B.

The pixel defining layer PDL may include an organic material or an inorganic material. In an exemplary embodiment, the pixel defining layer PDL may include a material such as a photoresist, a polyimide resin, an acrylic resin, a silicon compound, or a polyacrylic resin.

An organic light emitting element layer 312 is disposed on the first pixel electrodes 311 exposed by the pixel defining layer PDL.

A second pixel electrode 313 is disposed on the organic light emitting element layer 312. The second pixel electrode 313 may be a common electrode disposed over the entirety without distinguishing the pixels. The second pixel electrode 313 may be a cathode electrode of an organic light emitting diode.

The second pixel electrode 313 may include a material having a low work function. The second pixel electrode 313 may include Li, Ca, LiF/Ca, LiF/Al, Al, Mg, Ag, Pt, Pd, Ni, Au, Nd, Ir, Cr, BaF, Ba, a compound thereof, or a mixture thereof (for example, a mixture of Ag and Mg). The second pixel electrode 313 may be connected to a power supply line (not shown) through an electrode formed on the same layer as the first pixel electrode 311.

The aforementioned first pixel electrode 311, organic light emitting element layer 312, and second pixel electrode 313 may constitute an organic light emitting diode (OLED). Further, the first pixel electrode 311 to the second pixel electrode 313, shown in FIG. 5, may correspond to the light emitting element layer 30 of FIG. 2.

An encapsulation layer 450 may be disposed on the second pixel electrode 313. The encapsulation layer 450 includes an inorganic film and an organic film. The encapsulation layer 450 may include a plurality of laminated films. As shown in the drawing, the encapsulation layer 450 may be formed of a multilayer film including a first inorganic film 451, an organic film 452, and a second inorganic film 453, which are sequentially laminated. Here, the first inorganic film 451 and the second inorganic film 453 may include at least one selected from the group consisting of silicon oxide ($SiO_x$), silicon nitride ($SiN_x$), and silicon oxynitride ($SiON_x$), and the organic film 452 may include any one selected from the group consisting of epoxy, acrylate, and urethane acrylate.

The encapsulation layer 450, shown in FIG. 6, may correspond to the encapsulation layer 40 of FIG. 3.

The touch sensing unit 50a may be disposed on the encapsulation layer 450 in order. The touch sensing unit 50a may be disposed on the encapsulation layer 450 in order of a first touch conductive layer, a touch insulating layer 511, and a second touch conductive layer. Hereinafter, a laminate structure of the touch sensing unit 50a will be described with reference to FIGS. 7 and 8.

Referring to FIGS. 3 to 5, 7, and 8, the first sensing electrode IE1 and the second sensing electrode IE2 are disposed to cross each other. The first sensing electrode IE1 and the second sensing electrode IE2 may be insulated from each other with the touch insulating layer 511 therebetween at the intersection of the first sensing electrode IE1 and the second sensing electrode IE2.

The mesh patterns of any one of the first sensing electrode IE1 and the second sensing electrode IE2 may be electrically connected by a bridge wiring BE. In the drawings, a case where the mesh patterns of the first sensing electrode IE1 are physically connected and the mesh patterns of the second sensing electrode IE2 are electrically connected by the bridge wiring BE is described as an example, but the inventive concepts are not limited thereto. In another exemplary embodiment, the mesh patterns of the first sensing electrode IE1 may be electrically connected by the bridge wiring BE, and the mesh patterns of the second sensing electrode IE2 may be physically connected.

The bridge wiring BE may be disposed in an area overlapping the pixel definition layer PDL.

The first touch conductive layer may be disposed on the second inorganic film 453 of the encapsulation layer 450. In an exemplary embodiment, a second buffer layer 501 may be disposed between the encapsulation layer 450 and the first touch conductive layer. That is, the second buffer layer 501 may be disposed on the second inorganic film 453, and the second buffer layer 501 may function to smooth the surface of the encapsulating layer 450 and prevent the penetration of moisture or outside air. That is, the upper surface of the second buffer layer 501 may be a flat surface. The second buffer layer 501 may be an inorganic film including silicon nitride ($SIN_x$). The second buffer layer 201 may be a single-layer film or a multi-layer film. In another exemplary embodiment, the second buffer layer 501 may be omitted, and in this case, the first touch conductive layer may be directly disposed on the second organic film 453 of the encapsulation layer 450.

The thickness of the second buffer layer 501 may be about 1500 Å to 2500 Å.

The first touch conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). For example, the first touch conductive layer may have a three-layer structure of titanium (Ti)/aluminum (Al)/titanium (Ti).

The first touch conductive layer may include the aforementioned bridge wiring BE and signal wiring unit (RX, TX). That is, the bridge wiring BE and the signal wiring unit (RX, TX) may be disposed on the same layer, and may include the same material.

The touch insulating layer 511 is disposed on the first touch conductive layer. The touch insulating layer 511 may include at least one contact hole exposing a part of the bridge wiring BE and the signal wiring unit (RX, TX).

In an exemplary embodiment, the touch insulating layer 511 may be disposed over the entire surface of the substrate, but the inventive concepts are not limited thereto. The touch insulating layer 511 may include an organic material or an inorganic material. In this case, examples of the inorganic material may include silicon oxide ($SiO_x$), silicon nitride ($SiN_x$), silicon oxynitride, aluminum oxide, tantalum oxide, hafnium oxide, zirconium oxide, and titanium oxide. Examples of the organic material may include imide-based polymers, general purpose polymers such as polymethylmethacrylate (PMMA) and polystyrene (PS), polymer derivatives having a phenol group, acrylic polymers, aryle-ther-based polymers, amide-based polymers, fluorine-based polymers, p-xylene-based polymers, vinylalcohol-based polymers, and blends thereof. They may be used alone or in combination with each other. The touch insulating layer 511 may be a single-layer film or a multi-layer film composed of laminate films of different materials.

The thickness of the touch insulating layer 511 may be about 2500 Å to 6000 Å. The refractive index of the touch insulating layer 511 may be about 1.93 when it includes an inorganic material, and may be about 1.53 when it includes an organic material.

Referring to FIGS. 4 to 9, the touch insulating layer 511 includes a flat region FA having a flat upper surface having a first height H1 from a reference line and a lens region RA having a curved upper surface having a second height H2 different from the first height H1 from the reference line. The reference line may be an imaginary line based on the flat upper surface of the first or second buffer layer 201 or 501. The first height H1 of the flat region FA may be constant for each position, and the second height H2 of the lens region RA may be changed for each position without being constant. The upper surface of the touch insulating layer 511 in the lens region RA may be concave or convex. In the present exemplary embodiment, a case where the upper surface of the touch insulating layer 511 is concave will be described as an example.

The flat region FA may mainly overlap the pixel defining layer PDL. Therefore, the bridge wiring BE may be disposed below the flat region FA.

The lens region RA may mainly overlap the first openings L1_1, L1_2, and L1_3 exposed by the pixel defining layer PDL in the first pixel electrode 311. The boundary between the flat region FA and the lens region RA may be formed at a portion overlapping the pixel defining layer PDL and the first pixel electrode 311 or at a portion overlapping the first openings L1_1, L1_2, and L1_3.

In an exemplary embodiment, the width of the lens region RA may be substantially the same as the width of each of the first openings L1_1, L1_2, and L1_3, but the inventive concepts are not limited thereto.

The second height H2 may be less than the first height H1. The second height H2 may be configured to become generally lower toward the inside of the lens region RA from the boundary between the flat region FA and the lens region RA, but the inventive concepts are not limited thereto. The second height H2 may be the lowest at the center of the lens region RA. In another exemplary embodiment, the second height H2 may include a certain area that maintains the same thickness even if the distance from the boundary between the flat region FA and the lens region RA is different.

The second height H2 may be configured such that the change of a slope may generally decrease toward the inside of the lens region RA from the boundary between the flat region FA and the lens region RA. That is, the binary derivative value of the second height H2 with respect to the distance from the boundary between the flat region FA and the lens region RA may be generally negative, but the inventive concepts are not limited thereto. In another exemplary embodiment, in a part of the lens region RA, the binary derivative value of the second height H2 with respect to the distance may be 0 or positive. In this case, the shape of the lens region RA may be a trapezoidal shape where the lower side is shorter than the upper side.

The cross section of the lens region RA may have a substantially concave lens shape. That is, the cross section of the lens region RA may be a shape in which the thickness becomes thinner toward the center of the lens region RA. The lens region RA may function as a concave lens. While light emitted from the organic light emitting layer 312 passes through the lens region RA, the light may be relatively spread.

Further, when a more dense material is disposed on the upper layer of the lens region RA, the light emitted from the organic light emitting layer 312 has a condensing effect, and thus, front light efficiency may increase. Accordingly, the light trapped by the interface of the encapsulation layer 450 can be extracted, thereby increasing the total light amount.

The lens region RA may have a relatively steep slope at the boundary with the flat region FA, and may be gradually thinner toward the center portion of the lens region RA so as to have a relatively gentle slope at the center portion thereof. In an exemplary embodiment, in the lens region RA, the slope of the boundary between the lens region RA and the flat region FA (acute angle between the tangent line and the flat upper surface of the buffer layer, hereinafter referred to as a taper angle ($\theta$)) may be 50° to 80°.

The taper angle ($\theta$) may be adjusted to increase light efficiency. As the taper angle ($\theta$) decreases, front light efficiency may increase.

The lens region RA may be formed to have a circular pattern on a plane, but the inventive concepts are not limited thereto. When the lens region RA is formed to have a circular pattern on a plane, the light condensing effect may be enhanced regardless of the direction of the light emitted from the organic light emitting layer 312.

The second touch conductive layer is disposed on the touch insulating layer 511. In an exemplary embodiment, the second touch conductive layer may be disposed on the flat region FA of the touch insulating layer 511. The second touch conductive layer may include second openings L2_1, L2_2, and L2_3 for exposing a part of the touch insulating layer 511. The second openings L2_1, L2_2, and L2_3 may include the entire lens region RA of the touch insulating layer 511 and a part of the flat region FA adjacent to the lens region RA.

The second openings L2_1, L2_2, and L2_3 may include portions overlapping the first openings L1_1, L1_2, and L1_3. In an exemplary embodiment, the widths of the second openings L2_1, L2_2, and L2_3 may be greater than those of the first openings L1_1, L1_2, and L1_3. Accordingly, a desirable viewing angle and luminance ratio of the organic light emitting display device 1 can be ensured.

The second touch conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second touch conductive layer may be made of the same material as the first touch conductive layer and, for example, the second touch conductive layer may have a three-layer structure of titanium (Ti)/aluminum (Al)/titanium (Ti).

The second touch conductive layer may include the plurality of first sensing electrodes IE1 and the plurality of second sensing electrodes IE2, which have been described above. That is, the mesh patterns of the sensing electrodes IE1 and IE2 may all be disposed on the same layer, and may include the same material.

Some of the components of the second touch conductive layer may directly contact the first touch conductive layer through the contact holes of the touch insulating layer 511. For example, the mesh pattern of the second sensing electrode IE2 may be connected to the bridge wiring BE, and the first and second sensing electrodes IE1 and IE2 may be connected to the respective signal lines RX and TX.

The first and second sensing electrodes IE1 and IE2 may be disposed to overlap the pixel defining layer PDL. In an exemplary embodiment, the mesh patterns of the sensing electrodes IE1 and IE2 may be arranged so as to overlap each other within the area where the pixel defining layer PDL is disposed. That is, the width of the mesh pattern of each of the sensing electrodes IE1 and IE2 may be less than the width of the pixel defining layer PDL.

A black matrix BM and a liquid-repellent material layer LR may be sequentially laminated on the second touch conductive layer so as to overlap the second touch conductive layer.

The black matrix BM may be disposed directly on the mesh pattern of each of the sensing electrodes IE1 and IE2. The black matrix BM includes a material capable of blocking light. For example, the black matrix BM may include an organic material having a high degree of light absorbance. The black matrix BM may include a black pigment or a black dye. The black matrix BM includes a photosensitive organic material, and may include, for example, a colorant such as a pigment or a dye. The black matrix BM may have a single-layer structure or a multi-layer structure.

In an exemplary embodiment, the thickness of the black matrix BM may be about 2 μm to about 4 μm, but is not limited thereto.

The liquid-repellent material layer LR may be disposed directly on the black matrix BM. The liquid-repellent material layer LR may include an alignment material having liquid-repellent properties with respect to a color filter (CF_R, CF_G, CF_B) solution to be described later. The alignment material may be an organic polymer material. For example, the organic polymer material may include at least one of fluorinated silane promoters having hydrophobicity, fluorinated acryl monomers, or fluorinated alkyl organic materials.

In an exemplary embodiment, the thickness of the liquid-repellent material layer LR may be thinner than the thickness of the black matrix BM, but the present invention is not limited thereto.

The mesh pattern, the black matrix BM, and the liquid-repellent material layer LR, which are sequentially laminated, may form a dam. The dam may form a plurality of second openings L2_1, L2_2, and L2_3 that expose the touch insulating layer 511. The mesh pattern of each of the sensing electrodes IE1 and IE2, the black matrix BM, and the liquid-repellent material layer LR are sequentially laminated, thereby reducing the number of masks when manufacturing the organic light emitting display device 1.

Color filters CF_R, CF_G, and CF_B may be disposed on the touch insulating layer 511. The color filters CF_R, CF_G, and CF_B may be disposed in the second openings L2_1, L2_2, and L2_3 formed by the dam.

The color filters CF_R, CF_G, and CF_B may include first, second, and third color filters CF_R, CF_G, and CF_B. The first color filter CF_R may be disposed in the first light emitting region PXA_R, the second color filter CF_G may be disposed in the second light emitting region PXA_G, and the third color filter CF_B may be disposed in the third light emitting region PXA_B. In an exemplary embodiment, the first color filter CF_R may be a red color filter, the second color filter CF_G may be a green color filter, and the third color filter CF_B may be a blue color filter. That is, the first light emitting region PXA_R of a red color may include an organic light emitting layer 312 of a red color and a first color filter CF_R of a red color, the second light emitting region PXA_G of a green color may include an organic light emitting layer 312 of a green color and a second color filter CF_G of a green color, and the third light emitting region PXA_B of a blue color may include an organic light emitting layer 312 of a blue color and a third color filter CF_B of a blue color. In another exemplary embodiment, the first to third light emitting regions PXA_R, PXA_G, and PXA_B may include organic light emitting layers of a white color and color filters CF_R, CF_G, and CF_B of the corresponding colors, respectively. The organic light emitting layer of a white color may be formed by laminating two or more organic light emitting layers.

The first color filter CF_R selectively transmits red light. Here, the wavelength of the red light may be about 620 nm to about 750 nm. The second color filter CF_G selectively transmits green light. Here, the wavelength of the green light may be about 495 nm to about 570 nm. The third color filter CF_B selectively transmits blue light. Here, the wavelength of the blue light may be about 450 nm to about 495 nm.

The color filters CF_R, CF_G and CF_B of the same color are disposed on the respective organic light emitting layers 312 to prevent color mixture in the corresponding light emitting regions PXA_R, PXA_G, and PXA_B and increase color reproducibility. Further, since the color filters CF_R, CF_G and CF_B absorb external light at a considerable level, external light reflection may be reduced even without additionally providing a polarizing plate or the like.

The color filters CF_R, CF_G and CF_B not only transmit the light generated from the organic light emitting diodes but also reduce the reflectance of light incident from the outside. As the external light passes through the color filters CF_R, CF_G and CF_B, the amount of light is reduced to about ⅓. The light having passed through the color filters CF_R, CF_G and CF_B is partially eliminated, and is partially reflected from the components arranged under the color filters CF_R, CF_G, and CF_B, for example, the light emitting element layer 30 and the encapsulation layer 40. The reflected light is incident again on the color filters CF_R, CF_G, and CF_B. The luminance of the reflected light is lowered while the reflected light passes through the color filters CF_R, CF_G, and CF_B. Consequently, only a part of the external light is reflected from the organic light emitting display device 1. That is, external light reflectance decreases.

Each of the color filters CF_R, CF_G, and CF_B may include an organic material. In an exemplary embodiment, the refractive index of each of the color filters CF_R, CF_G, and CF_B may be higher than that of the touch insulating layer 511. That is, each of the color filters CF_R, CF_G, and CF_B may include a relatively dense material, and the touch insulating layer 511 may include a relatively sparse material. For example, when the touch insulating layer 511 has a refractive index of about 1.53, each of the color filters CF_R, CF_G, and CF_B may have a refractive index of about 1.65. When the refractive index of each the color filters CF_R, CF_G, and CF_B is higher than the refractive index of the touch insulating layer 511, the light condensing effect of side light can be enhanced, and the light trapped by the interface of the encapsulation layer 450 can be extracted, thereby increasing the total light amount.

The second buffer layer 501, the first and second touch conductive layers, and the touch insulating layer 511 may correspond to the touch layer 50 of FIG. 2. Further, the black matrix BM, the liquid-repellent material layer LR, and the color filters CF_R, CF_G, and CF_B may correspond to the anti-reflective layer 60 of FIG. 2.

A window substrate 701 may be disposed on the liquid-repellent material layer LR and the color filters CF_R, CF_G, and CF_B. The window substrate 701 may be a transparent substrate, such as a glass substrate or a plastic substrate.

The window substrate 701 may correspond to the second substrate 70 of FIG. 2. The window substrate 701 may be attached to the liquid-repellent material layer LR and the color filters CF_R, CF_G, and CF_B by an adhesive member 710 interposed therebetween. The adhesive member 710 may include a film having adhesiveness, for example, an optically clear adhesive (OCA) film. As another example, the adhesive member 710 may include an optically clear resin (OCR) film.

Hereinafter, luminance ratios of a lens region with respect to a width and a taper angle (θ) according to the colors of the light emitting regions PXA_R, PXA_G, and PXA_B will be described with reference to FIGS. 10 to 12.

Figure 10:
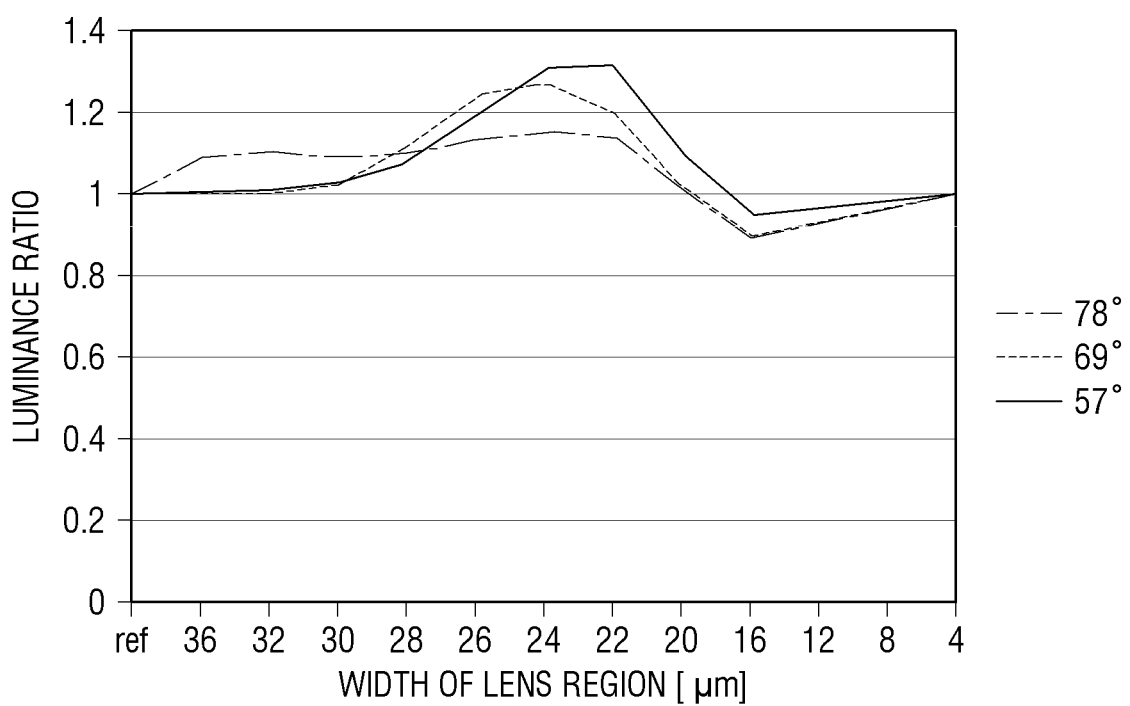
FIG. 10 is a graph of a luminance ratio of a lens region of red light with respect to a width for various taper angles.

FIG. 10 is a graph of a luminance ratio of a lens region of red light with respect to a width for various taper angles. FIG. 11 is a graph of a luminance ratio of a lens region of green light with respect to a width for various taper angles. FIG. 12 is a graph of a luminance ratio of a lens region of blue light with respect to a width for various taper angles.

Figure 11:
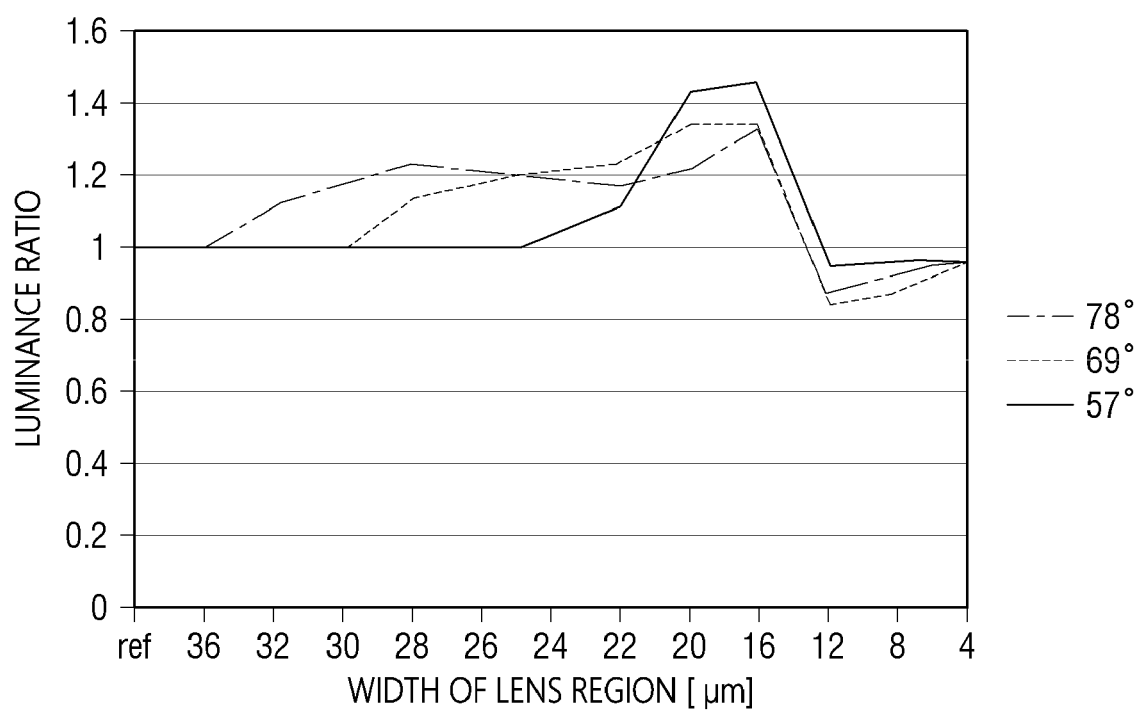
FIG. 11 is a graph of a luminance ratio of a lens region of green light with respect to a width for various taper angles.
Figure 12:
FIG. 12 is a graph of a luminance ratio of a lens region of blue light with respect to a width for various taper angles.

Referring to FIGS. 10 to 12, in the case of red light, regardless of the taper angle, the lens region RA has a large luminance ratio when the width of the lens region RA is about 20 μm to about 26 μm. As the taper angle (θ) decreases, the maximum value of the luminance ratio increases.

In the case of green light, the lens region RA has a large luminance ratio when the width of the lens region RA is about 21 μm to about 26 μm. As the taper angle (θ) decreases, the maximum value of the luminance ratio increases.

In the case of blue light, the lens region RA has a large luminance ratio when the width of the lens region RA is about 12 μm to about 21 μm. As the taper angle (θ) decreases, the maximum value of the luminance ratio increases.

For this reason, the area of the lens region RA may increase in order of a green light emitting region, a red light emitting region, and a blue light emitting region. Similarly, the width of the area of the lens region RA may increase in order of a green light emitting region, a red light emitting region, and a blue light emitting region.

Hereinafter, a process of laminating the touch layer 50 and the anti-reflective layer 60 will be described.

Figure 13:
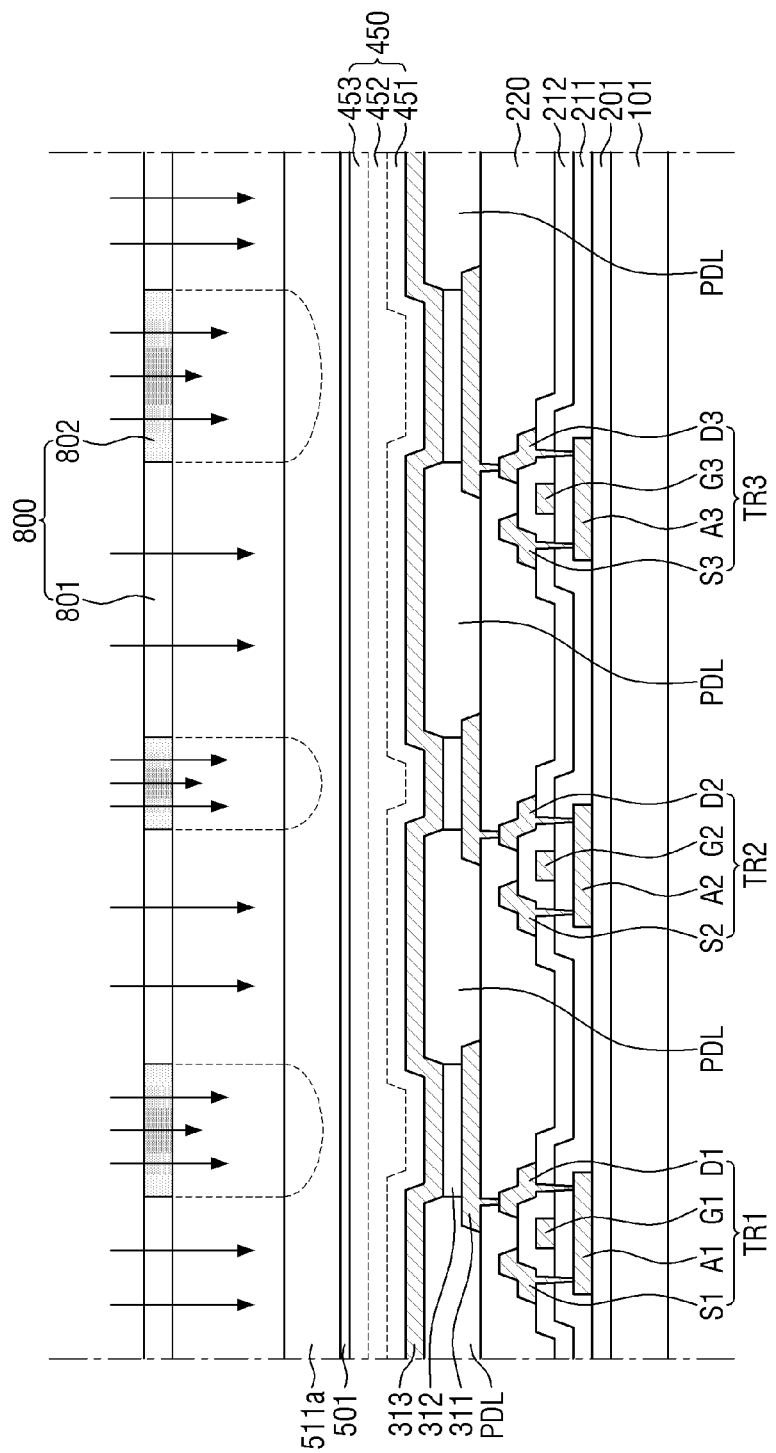
FIG. 13 and FIG. 14 are cross-sectional views illustrating a process of manufacturing a touch layer and an anti-reflective layer of an organic light emitting display device according to an exemplary embodiment.
Figure 14:
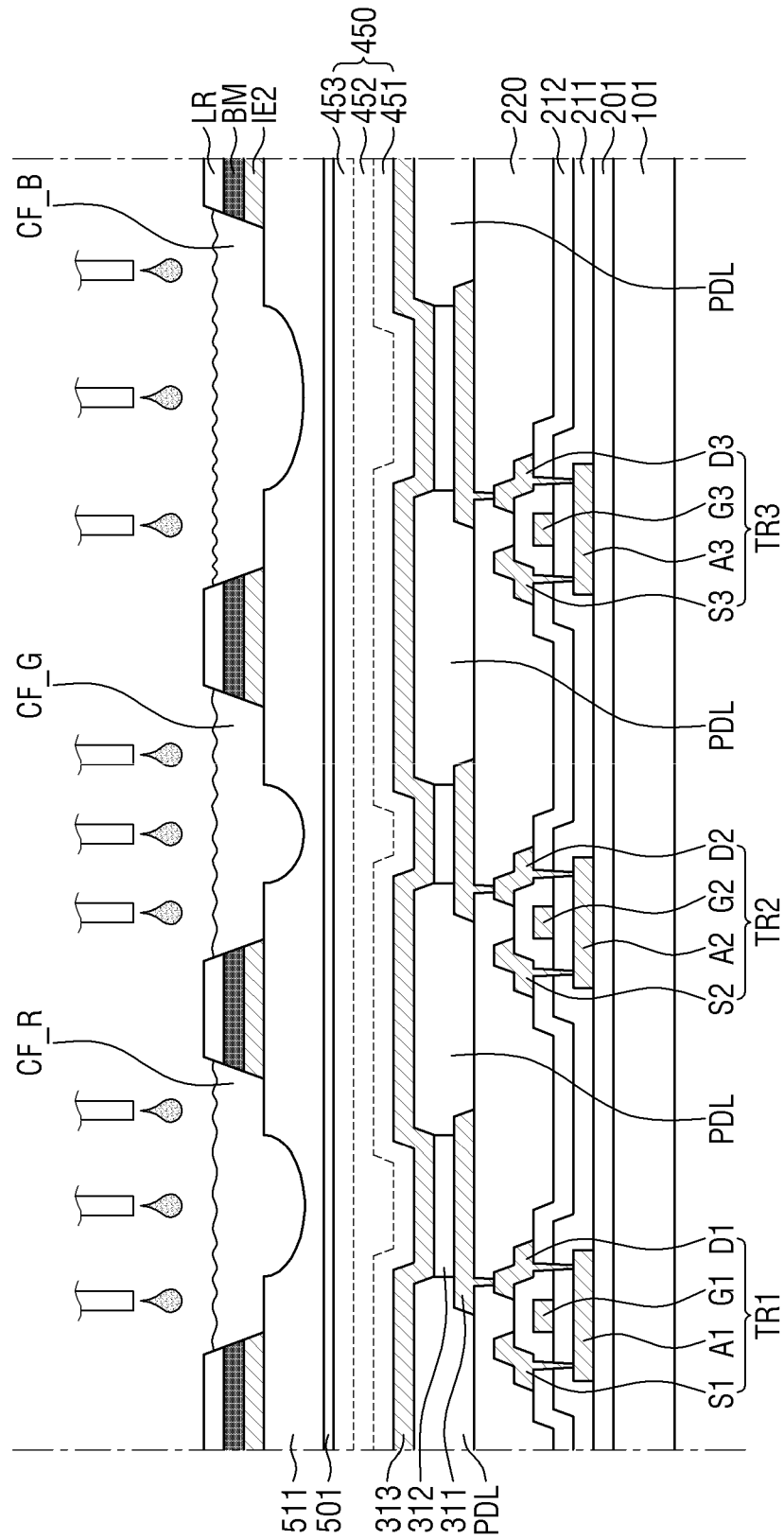

FIGS. 13 and 14 are cross-sectional views illustrating a process of manufacturing a touch layer and an anti-reflective layer of an organic light emitting display device according to an embodiment.

Referring to FIG. 13, an insulating material layer 511a is formed on the second buffer layer 501. The insulating material layer 511a may include the materials exemplified in the description of the touch insulating layer 511. The insulating material layer 511a may be applied by slit coating, spin coating, gravure printing, or the like. For example, in an exemplary embodiment, For example, the insulating material layer 511a may be laminated by using chemical vapor deposition (CVD) using a chemical reaction.

The insulating material layer 511a may include a photosensitive material. The photosensitive material may be a positive-type photosensitive material or a negative-type photosensitive material. In the present exemplary embodiment, a case where the insulating material layer 511a includes a negative photosensitive material is exemplified.

Subsequently, a photoresist layer (not shown) is formed on the insulating material layer 511a. The photoresist layer may include fluorinated silane promoters having hydrophobicity, fluorinated acryl monomers, or fluorinated alkyl monomers materials. The photoresist layer may be a negative-type photoresist layer or a positive-type photoresist layer.

Subsequently, a mask 800 is disposed over the photoresist layer, and the photoresist layer is irradiated with light through the mask 800. The mask 800 may be, for example, a multi-tone mask 800. The multi-tone mask 800 includes a light transmitting portion 801 that transmits most of the applied light, and a multi-light transmitting portion 802 that transmits a part of the applied light and blocks a part of the applied light. In the multi-light transmitting portion 802, the amount of transmitted light may decrease toward the inside of the multi-light transmitting portion 802.

The light transmitting portion 801 corresponds to an area where the flat region FA is to be formed, and the multi-light transmitting portion 802 corresponds to an area where the lens region RA is to be formed. Subsequently, as shown in FIG. 5, the flat region FA and lens region RA of the second touch insulating layer 511 may be completed through exposure and development processes.

Referring to FIG. 14, a dam and color filters CF_R, CF_G, and CF_B may be sequentially formed on the second touch insulating layer 511.

The dam may be formed by sequentially laminating a second touch conductive layer, a black matrix BM, and a liquid-repellent material layer LR. Here, in an exemplary embodiment, the second touch conductive layer may be formed by sequentially laminating titanium (Ti), aluminum (Al), and titanium (Ti).

A liquid-repellent material is patterned on the black matrix, and then the color filters CF_R, CF_G, and CF_B for each light emitting region may be formed using a printing method, such as an inkjet printing method. The dam, having a predetermined thickness, primarily prevents the color filters CF_R, CF_G, and CF_B from spreading toward the adjacent light emitting regions PXA_R, PXA_G, and PXA_B, and the liquid-repellent material layer LR included in the upper portion of the dam secondarily prevents the color filters CF_R, CF_G, and CF_B from spreading toward the adjacent light emitting regions PXA_R, PXA_G, and PXA_B.

The adhesive member 710 and the window substrate 701 may be sequentially laminated on the dam and the color filters CF_R, CF_G, and CF_B, as shown in FIG. 6.

Next, an organic light emitting display device according to another embodiment will be described. Hereinafter, the same elements as those in FIGS. 1 to 14 are not described, and the same or similar reference numerals are used.

Figure 15:
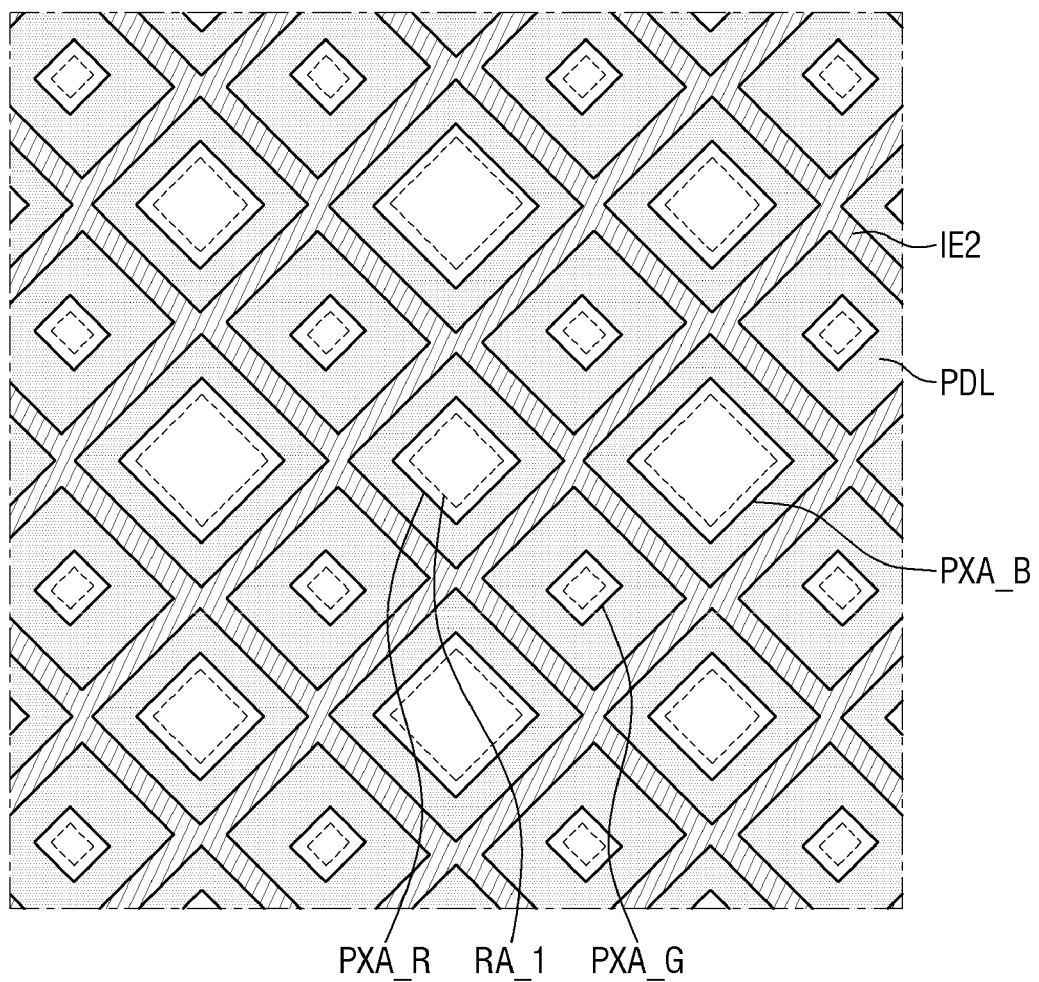
FIG. 15 and FIG. 16 are enlarged views of parts of organic light emitting display devices according to other exemplary embodiments.
Figure 16:
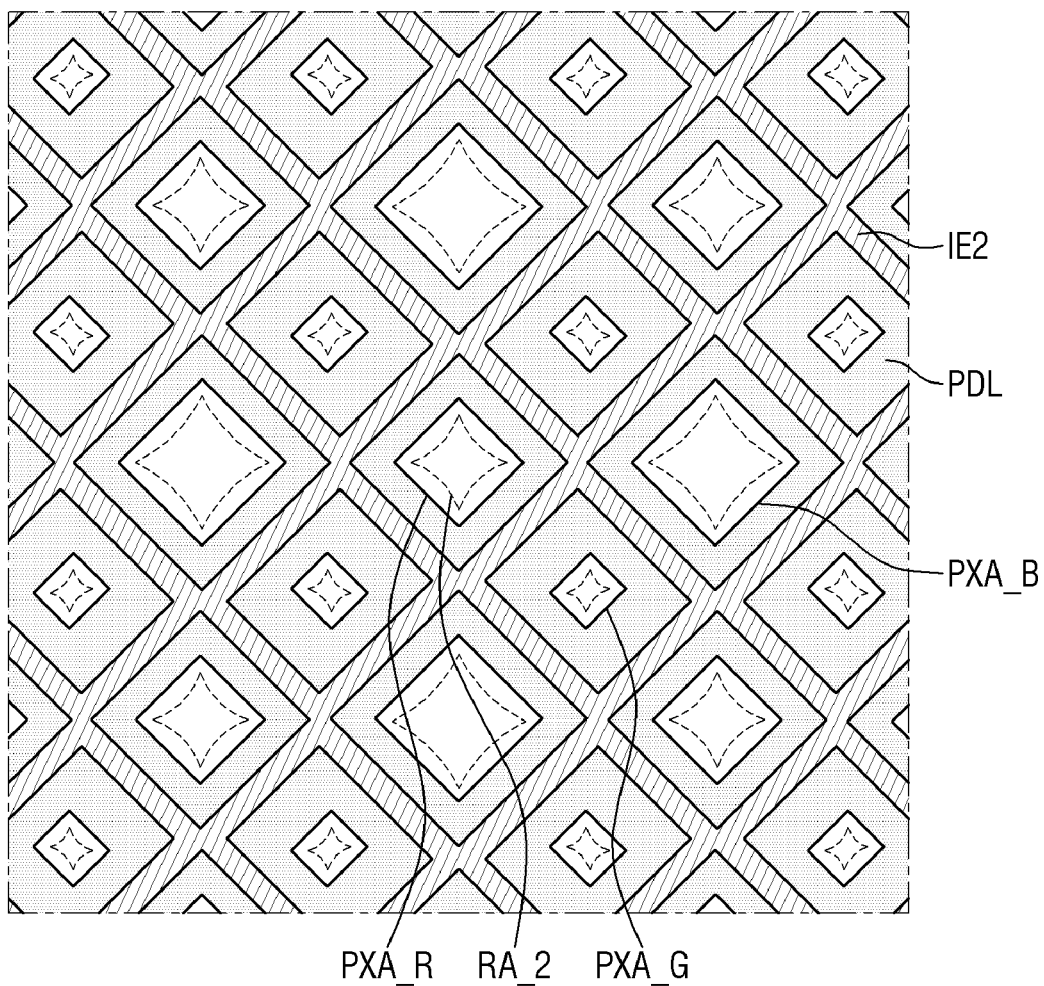

FIGS. 15 and 16 are enlarged views of parts of organic light emitting display devices according to other exemplary embodiments. FIGS. 15 and 16 are modification examples of FIG. 5, respectively.

Referring to FIGS. 15 and 16, organic light emitting display devices according to these exemplary embodiments are different from the organic light emitting display device of FIG. 5 in that the planar shape of the lens region RA is different from that of FIG. 5.

The planar shape of the lens region RA may be a polygonal shape. For example, the planar shape of the lens region RA may be a rectangular shape corresponding to each of the light emitting regions PXA_R, PXA_G, and PXA_B.

Further, the planar shape of the lens region RA may be an atypical shape.

Figure 17:
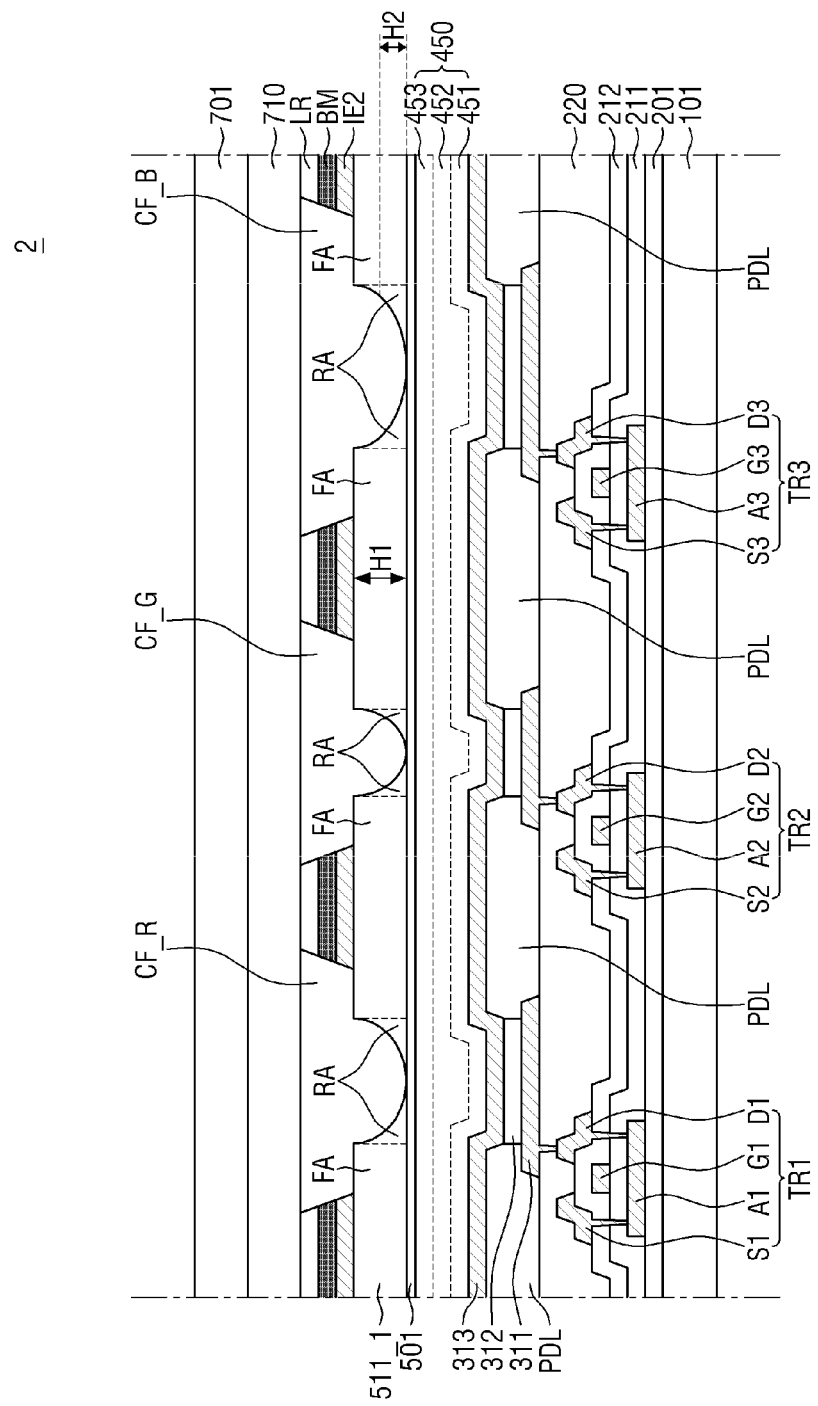
FIG. 17 is a cross-sectional view of a part of an organic light emitting display device according to another exemplary embodiment.

FIG. 17 is a cross-sectional view of a part of an organic light emitting display device according to another exemplary embodiment. FIG. 17 is a modification example of FIG. 6.

Referring to FIG. 17, an organic light emitting display devices 2 according to another exemplary embodiment is different from the organic light emitting display device 1 of FIG. 6 in that it has a portion where the second height H2 of a touch insulating layer 511_1 in the lens region RA is substantially 0.

The touch insulating layer 511_1 of the organic light emitting display devices 2 according to another exemplary embodiment may include a flat region FA and a lens region RA. In the lens region RA, the second height H2 of the touch insulating layer 511_1 may be less toward the inside of the lens region RA from the boundary between the flat region FA and the lens region RA. The second height H2 of the touch insulating layer 511_1 may be zero at the center of the lens region RA.

Figure 18:
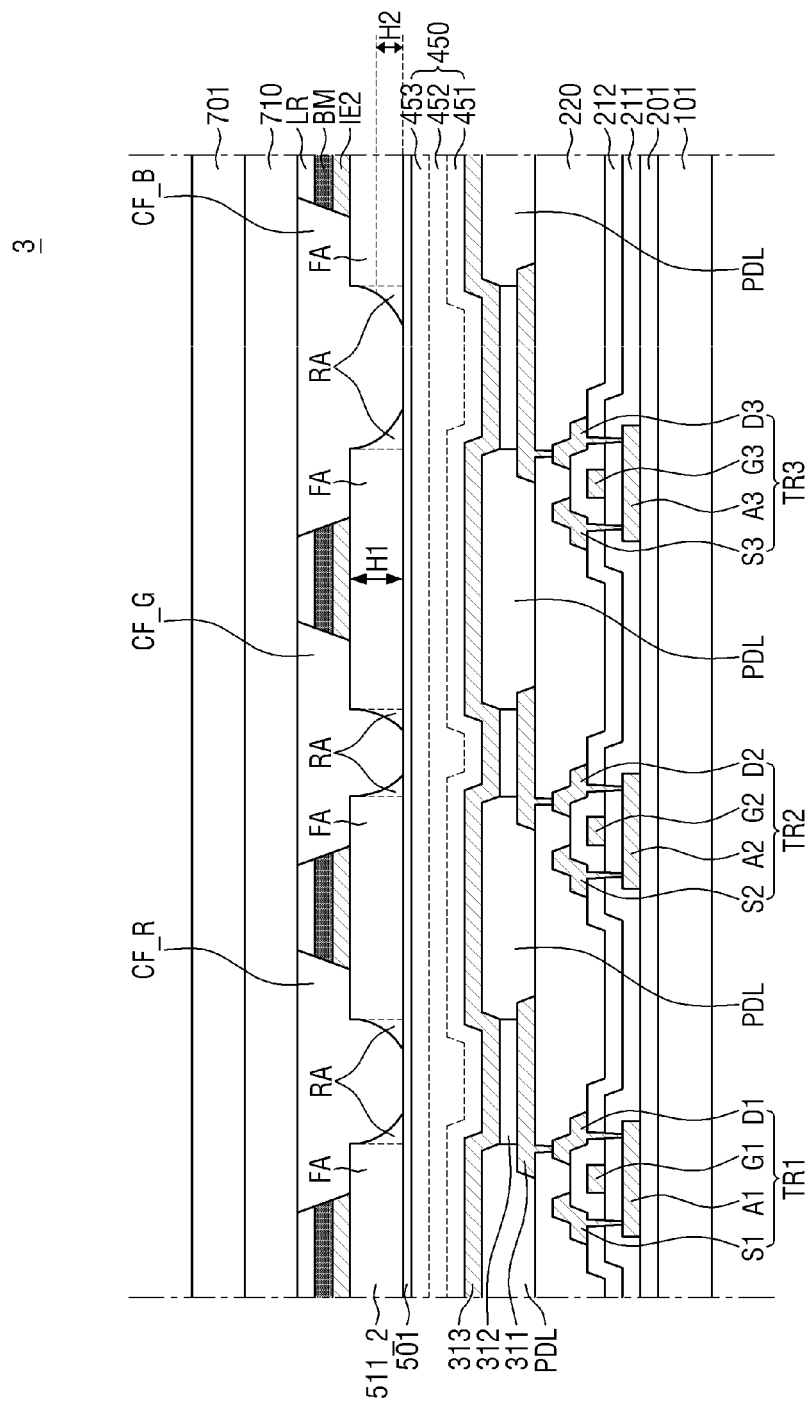
FIG. 18 is a cross-sectional view of a part of an organic light emitting display device according to another exemplary embodiment.

FIG. 18 is a cross-sectional view of a part of an organic light emitting display device according to another exemplary embodiment. FIG. 18 is a modification example of FIG. 6.

Referring to FIG. 18, an organic light emitting display devices 3 according to another exemplary embodiment is different from the organic light emitting display device 1 of FIG. 6 in that a touch insulating layer 511_2 is composed of a plurality of insulating patterns spaced apart from each other.

The touch insulating layer 511_2 of the organic light emitting display devices 3 according to this exemplary embodiment may include a plurality of insulating patterns. Each of the plurality of insulating patterns may include a flat region FA, and a lens region RA may be formed between adjacent insulating patterns.

Adjacent insulating patterns may be spaced apart from each other with respect to the lens region RA. The lens region RA may expose a part of the upper surface of the second buffer layer 501. The second buffer layer 501 and the color filters CF_R, CF_G, and CF_B may include portions directly in contact with each other.

Figure 19:
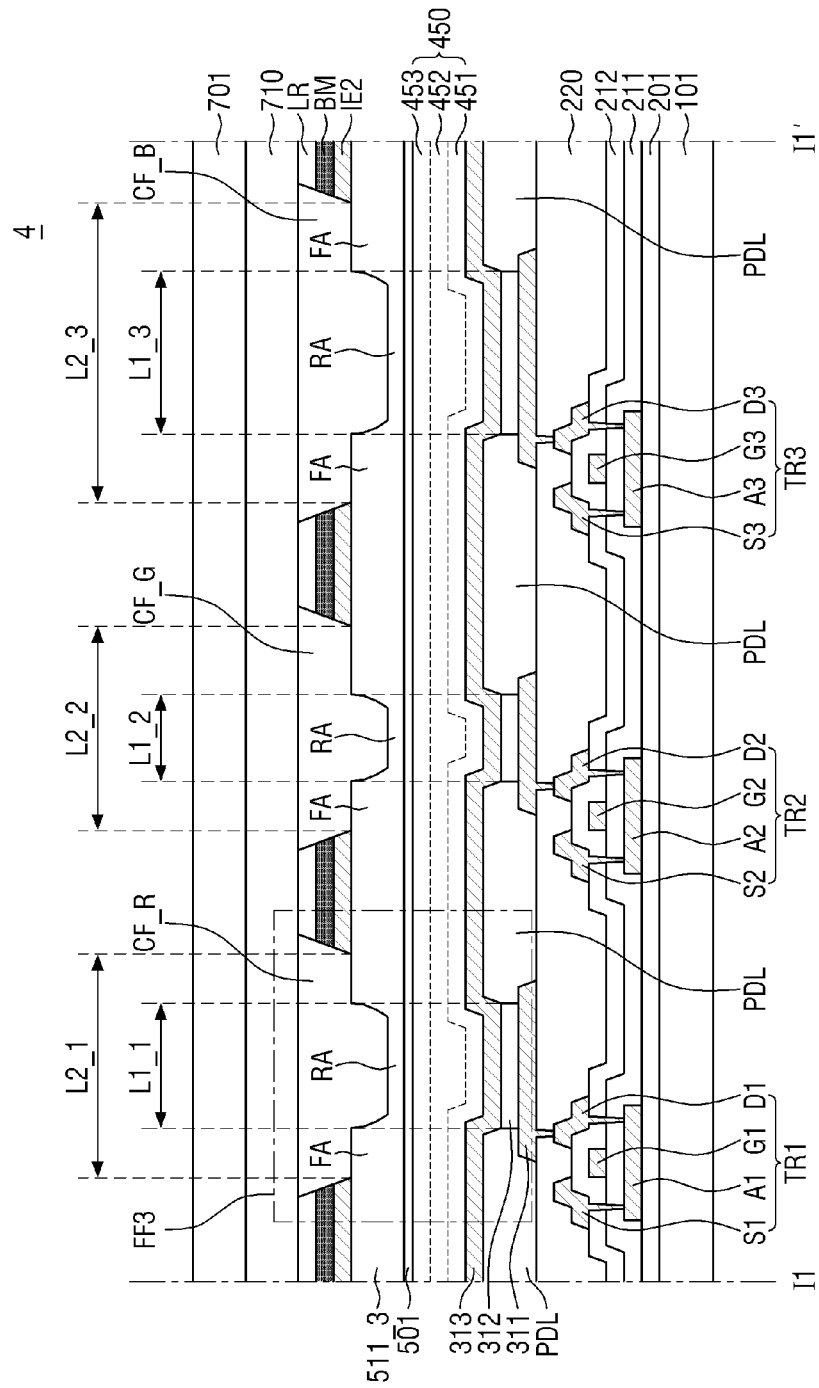
FIG. 19 is a cross-sectional view of a part of an organic light emitting display device according to another exemplary embodiment.

FIG. 19 is a cross-sectional view of a part of an organic light emitting display device according to another exemplary embodiment. FIG. 19 is a modification example of FIG. 6.

Referring to FIG. 19, an organic light emitting display devices 4 according to another exemplary embodiment is different from the organic light emitting display device 1 of FIG. 6 in that a touch insulating layer 511_3 has a substantially flat surface at the center of the lens region RA.

The slope of the touch insulating layer 511_3 of the organic light emitting display 4 according to this exemplary embodiment may become gentle toward the center of the lens region RA. The upper surface of the touch insulating layer 511_3 may be substantially flat in a portion of the lens region RA including the center thereof.

Figure 20:
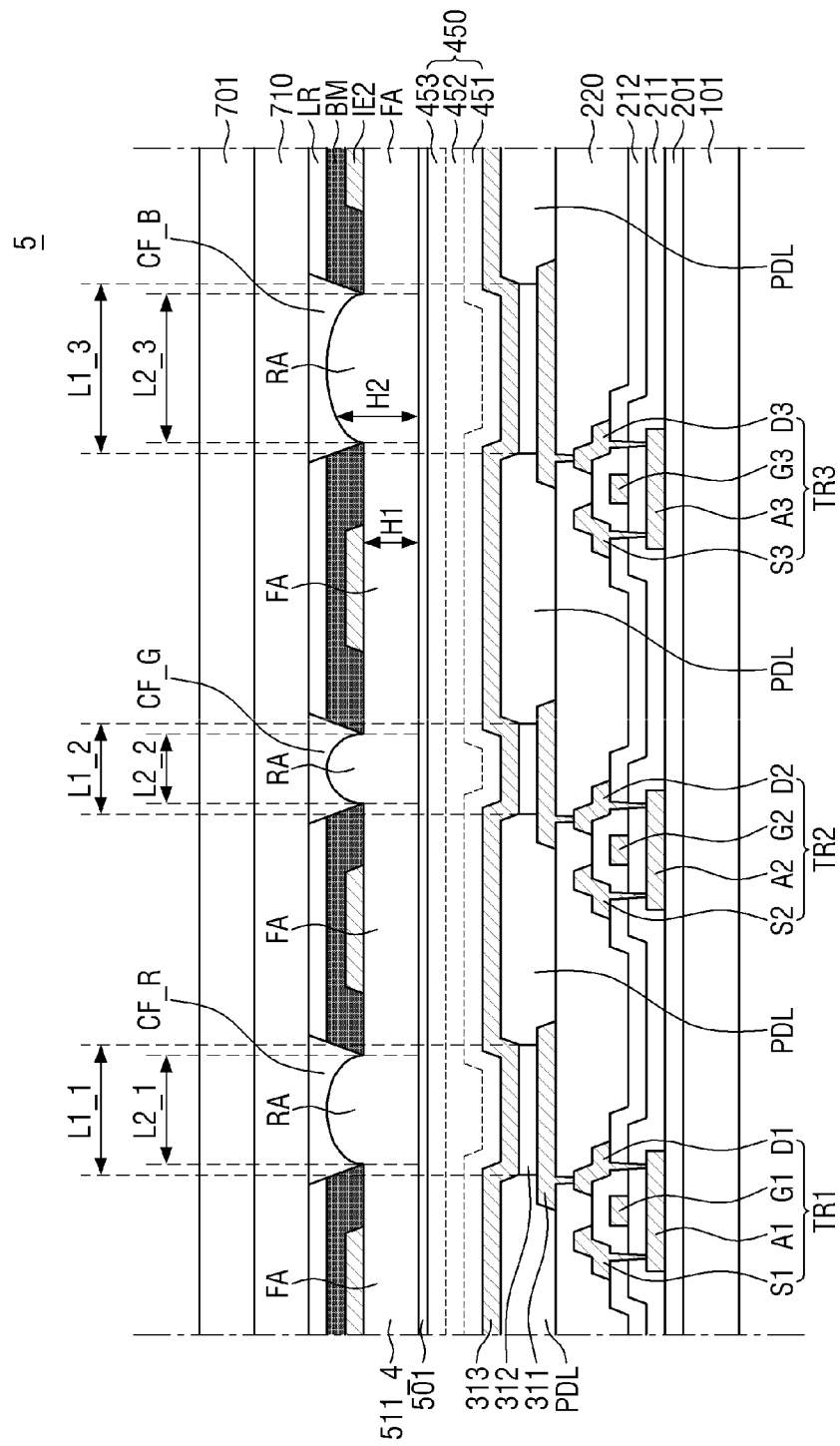
FIG. 20 is a cross-sectional view of a part of an organic light emitting display device according to another exemplary embodiment.

FIG. 20 is a cross-sectional view of a part of an organic light emitting display device according to another exemplary embodiment. FIG. 20 is a modification example of FIG. 6.

Referring to FIG. 20, an organic light emitting display devices 5 according to another exemplary embodiment is different from the organic light emitting display device 1 of FIG. 6 in that the lens region RA of a touch insulating layer 511_4 has a convex lens shape.

The touch insulating layer 511_4 of the organic light emitting display 5 according to this embodiment has an upper surface of a constant height, and includes a flat region FA having a first height H1 and a lens region RA having a second height H2 greater than the first height H1.

In the lens region RA, the cross section of the touch insulating layer 511_4 may have a convex lens shape. The cross section of the lens region RA may be a shape in which the thickness becomes thicker toward the center of the lens region RA. The lens region RA can function substantially as a convex lens.

The height of the upper surface of the touch insulating layer 511_4 may gradually increase toward the inside of the lens region RA from the boundary between the flat region FA and the lens region RA. The height of the upper surface of the touch insulating layer 511_4 may be highest at the center of the lens region RA.

The binary derivative value of the height of the upper surface of the touch insulating layer 511_4 with respect to the distance from the boundary between the flat region FA and the lens region RA may be generally negative.

A dam may be disposed on the flat region FA of the touch insulating layer 511_4. The dam may have a structure in which a second touch conductive layer, a black matrix BM, and a liquid-repellent material layer LR are laminated in order. The dam may include a plurality of second openings L2_1, L2_2, and L2_3 that expose a part of the touch insulating layer 511_4. In an embodiment, the widths of the second openings L2_1, L2_2, and L2_3 may be narrower than the widths of the first openings L1_1, L1_2, and L1_3, but the present invention is not limited thereto.

The width of the black matrix BM may be greater than the width of the pixel definition layer PDL. That is, the pixel defining layer PDL may be superposed in the black matrix BM. The width of the black matrix BM may be formed to be wider than the width of the pixel defining layer PDL, so as to reduce the reflectance to external light reflection.

The cross section of the lens region RA may be formed to have a convex lens shape, so as to increase the scattering effect of light emitted from an organic light emitting diode.

The light emitted from the organic light emitting layer 320 may be condensed by the cross-sectional shape of the lens region RA. The color filters CF_R, CF_G, and CF_B may be formed of a material sparser than the material of the organic light emitting layer 320, so that the light condensed by refraction may be scattered again.

Accordingly, the reflectance, viewing angle, and luminance ratio of the light emitted from an organic light emitting diode can be increased.

The dam may be formed such that the black matrix BM covers the mesh pattern of each of the sensing electrodes IE1 and IE2. The black matrix BM may occupy a relatively large area in comparison with the area of the mesh pattern of each of the sensing electrodes IE1 and IE2 in a plan view. Accordingly, the external light reflectance of the organic light emitting display device 4 can be decreased as the area of the black matrix BM increases.

As described above, according to the exemplary embodiments of the present invention, the organic light emitting display device can secure a large viewing angle and a large luminance ratio.

Further, the organic light emitting display device can reduce external light reflection by a touch electrode.

Moreover, in the manufacturing of the organic light emitting display device, the number of masks can be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light emitting display device, comprising:
a base layer;
a conductive layer disposed on the base layer;
an insulating layer disposed on the conductive layer and comprising a flat region having a flat surface and a lens region having a concave surface recessed toward the base layer;
a dam disposed on the insulating layer and defining an opening exposing the lens region; and
a color filter disposed on the lens region of the insulating layer and filling the opening,
wherein:
the dam comprises a sensing electrode;
the conductive layer is disposed between the base layer and the insulating layer;
the insulating layer includes a contact hole exposing the conductive layer;
the conductive layer and the sensing electrode contact each other through the contact hole; and
the color filter directly contacts the concave surface of the insulating layer.

2. The organic light emitting display device of claim 1, wherein the dam comprises a liquid-repellent material layer disposed on the sensing electrode.

3. The organic light emitting display device of claim 2, wherein the dam further comprises a black matrix disposed between the sensing electrode and the liquid-repellent material layer.

4. The organic light emitting display device of claim 3, wherein the black matrix covers the sensing electrode.

5. The organic light emitting display device of claim 1, wherein the color filter directly contacts the dam.

6. The organic light emitting display device of claim 1, wherein the conductive layer has a three-layer structure of titanium (Ti)/aluminum (Al)/titanium (Ti).

7. The organic light emitting display device of claim 1, wherein the lens region has a concave shape, and a refractive index of the color filter is greater than a refractive index of the insulating layer.

8. The organic light emitting display device of claim 1, wherein the sensing electrode is disposed directly on the insulating layer.

9. The organic light emitting display device of claim 1, wherein the sensing electrode has a three-layer structure of titanium (Ti)/aluminum (Al)/titanium (Ti).

10. The organic light emitting display device of claim 1, wherein a bending area and a non-bending area are defined in the base layer.

11. The organic light emitting display device of claim 1, wherein the insulating layer includes an inclined surface in the lens region, and the inclined surface has a slope of 50° to 80°.

12. The organic light emitting display device of claim 1, wherein the lens region has a width of 20 μm to 26 μm.

13. The organic light emitting display device of claim 1, wherein:
the base layer defines a light emitting region and a non-light emitting region surrounding the light emitting region;
the dam is disposed in the non-light emitting region; and
the lens region overlaps the light emitting region.

14. An organic light emitting display device, comprising:
a base substrate;
a pixel electrode disposed on the base substrate;
a pixel defining layer disposed on the pixel electrode and having a first opening exposing a part of the pixel electrode;
an organic light emitting layer disposed on the exposed pixel electrode;
a common electrode disposed on the organic light emitting layer and the pixel defining layer;
an encapsulation layer disposed on the common electrode;
a first touch conductive layer disposed on the encapsulation layer, the first touch conductive layer including a bridge wiring;
an insulating layer disposed on the first touch conductive layer, the insulating layer including a concave surface recessed toward the base substrate;
a dam disposed on the insulating layer and having a second opening exposing at least a part of the insulating layer; and
a color filer disposed on the exposed insulating layer,
wherein:
the first touch conductive layer is disposed between the encapsulation layer and the insulating layer;
the dam comprises:
a second touch conductive layer disposed on the insulating layer, the second touch conductive layer including a sensing electrode;
a black matrix disposed on the second touch conductive layer; and
a liquid-repellent material layer disposed on the black matrix;
the insulating layer includes a contact hole exposing the first touch conductive layer;
the bridge wiring of the first touch conductive layer and the sensing electrode of the second touch conductive layer contact each other through the contact hole; and
the color filter directly contacts the concave surface of the insulating layer.

15. The display device of claim 14, wherein the insulating layer includes a flat region overlapping the pixel defining layer and a lens region overlapping the first opening.

16. The display device of claim 14, wherein the second opening overlaps the first opening.

17. The display device of claim 16, wherein a width of the first opening is less than a width of the second opening.

18. The display device of claim 14, wherein:
the second touch conductive layer and the black matrix are in direct contact with each other; and
the black matrix and the liquid-repellent material layer are in direct contact with each other.

19. The display device of claim 14, wherein the insulating layer comprises an organic material.

20. The display device of claim 14, wherein the color filter comprises a material denser than a material of the insulating layer.

21. The organic light emitting display device of claim 5, wherein the sensing electrode directly contacts the color filter.

* * * * *